(12) United States Patent
Yu et al.

(10) Patent No.: US 12,002,512 B2
(45) Date of Patent: Jun. 4, 2024

(54) SEMICONDUCTOR DEVICE

(71) Applicant: Samsung Electronics Co., Ltd., Suwon-si (KR)

(72) Inventors: Changyeon Yu, Hwaseong-si (KR); Pansuk Kwak, Goyang-si (KR); Daeseok Byeon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 113 days.

(21) Appl. No.: 17/709,910

(22) Filed: Mar. 31, 2022

(65) Prior Publication Data
US 2023/0041064 A1     Feb. 9, 2023

(30) Foreign Application Priority Data
Aug. 9, 2021    (KR) ................ 10-2021-0104592

(51) Int. Cl.
*G11C 16/00*     (2006.01)
*G11C 16/04*     (2006.01)
*G11C 16/08*     (2006.01)

(52) U.S. Cl.
CPC .......... *G11C 16/0483* (2013.01); *G11C 16/08* (2013.01)

(58) Field of Classification Search
CPC ....... G11C 16/0483; G11C 16/08; G11C 5/02; G11C 5/063; G11C 8/10; G11C 11/412; G11C 16/04; G11C 16/24; G11C 16/26; G11C 2029/5004; G11C 29/50004; G11C 5/148; G11C 2029/1204; G11C 2029/5602; G11C 29/025; G11C 29/56016; H01L 27/0688; H01L 29/7926; H01L 2224/08145; H01L 24/08; H01L 25/0657; H01L 25/18; H01L 2924/1431; H01L 2924/14511; H10B 43/27; H10B 41/10; H10B 41/41; H10B 41/50; H10B 43/10;
(Continued)

(56) References Cited

U.S. PATENT DOCUMENTS 7,057,915 B2    6/2006   Futatsuyama
7,679,133 B2    3/2010   Son et al.
(Continued)

FOREIGN PATENT DOCUMENTS

EP           2985763 B1    4/2019
KR         102116671 B1    6/2020

*Primary Examiner* — Thong Q Le
(74) *Attorney, Agent, or Firm* — Harness, Dickey & Pierce, P.L.C.

(57) ABSTRACT

A semiconductor device includes a memory cell array including a plurality of memory blocks, each of the plurality of memory blocks including select transistors and memory cells; pass transistors configured to provide select signals to select lines connected to a selected memory block; and ground transistors configured to supply a first voltage to select lines connected to unselected memory blocks. The ground transistors include at least one common gate structure, at least one common active region, and individual active regions, and each of the common gate structure and the common active region are shared by two or more ground transistors, among the ground transistors. The common gate structure is between the common active region and the individual active regions, and includes a first region extending in a first direction and a second region extending in a second direction, intersecting the first direction.

20 Claims, 24 Drawing Sheets

(58) Field of Classification Search
CPC ........ H10B 43/40; H10B 43/50; H10B 41/40;
H10B 41/27
USPC .... 365/230.03, 154, 185.11, 185.13, 185.16,
365/230.01, 230.06
See application file for complete search history.

(56) References Cited

U.S. PATENT DOCUMENTS

| | | | |
|---|---|---|---|
| 8,553,466 | B2 | 10/2013 | Han et al. |
| 8,559,235 | B2 | 10/2013 | Yoon et al. |
| 8,593,865 | B2 * | 11/2013 | Kim ........................ G11C 5/02 |
| | | | 365/185.11 |
| 8,654,587 | B2 | 2/2014 | Yoon et al. |
| 8,971,114 | B2 | 3/2015 | Kang et al. |
| 9,659,636 | B2 | 5/2017 | Lee |
| 9,666,286 | B2 | 5/2017 | Lee |
| 10,741,247 | B1 | 8/2020 | Yeh et al. |
| 2005/0141284 | A1 | 6/2005 | Futatsuyama |
| 2011/0233648 | A1 | 9/2011 | Seol et al. |
| 2012/0201080 | A1 | 8/2012 | Kang et al. |
| 2016/0035423 | A1 | 2/2016 | Nam et al. |

\* cited by examiner

SEMICONDUCTOR DEVICE

CROSS-REFERENCE TO RELATED APPLICATION(S)

This application claims benefit of priority to Korean Patent Application No. 10-2021-0104592 filed on Aug. 9, 2021 in the Korean Intellectual Property Office, the disclosure of which is incorporated herein by reference in its entirety.

BACKGROUND

The present inventive concepts relate to semiconductor devices.

A semiconductor device may include a cell region, in which memory cells for writing data are disposed, and a peripheral circuit region in which circuits for controlling the cell region are disposed. The peripheral circuit region may include a row decoder, a page buffer, a voltage generator, a control logic circuit, and the like. The row decoder may be connected to the cell region through wordlines, ground select lines, string select lines, and the like. To improve integration density of a semiconductor device, various methods of increasing integration density of the cell region, as well as the peripheral circuit region, have been proposed.

SUMMARY

Example embodiments provide semiconductor devices having performance and integration density improved by forming low-voltage devices such that the low-voltage devices share an active region in a peripheral circuit region.

Example embodiments provide semiconductor devices having performance and integration density improved by forming low-voltage devices and high-voltage device in different directions in a peripheral circuit region.

According to some example embodiments, a semiconductor device includes: a memory cell array including a plurality of memory blocks, each of the plurality of memory blocks including select transistors and memory cells; an address decoder configured to generate a first control signal and a second control signal in response to a received address; a plurality of metal lines connected to the plurality of memory blocks; pass transistors configured to electrically connect metal lines, connected to a selected memory block, among the plurality of metal lines, to the address decoder in response to the first control signal; and ground transistors configured to supply a first voltage to metal lines, connected to unselected memory blocks, among the plurality of metal lines, in response to the second control signal. The ground transistors include at least one common gate structure, at least one common active region, and individual active regions, and each of the common gate structure and the common active region are shared by two or more ground transistors, among the ground transistors. The common gate structure is between the common active region and the individual active regions, and includes a first region extending in a first direction and a second region extending in a second direction, intersecting the first direction.

According to some example embodiments, a semiconductor device includes: a memory cell array including a plurality of memory blocks, each of the plurality of memory blocks including a plurality of cell strings selected by a select line; pass transistors configured to provide select signals to select lines, connected to a selected memory block, in response to a first block select signal; and ground transistors configured to supply a first voltage to select lines, connected to unselected memory blocks, in response to a second block select signal. The ground transistors include at least one common gate structure, at least one common active region, and individual active regions, and each of the common gate structure and the common active region is shared by two or more ground transistors, among the ground transistors. The common gate structure includes three or more gate regions extending in different directions. The common active region and each of the individual active regions are adjacent to two gate regions, among the three or more gate regions.

According to some example embodiments, a semiconductor device includes: a memory cell array including a plurality of memory blocks, each of the plurality of memory blocks including a plurality of cell strings selected by a select line; pass transistors configured to provide select signals to select lines, connected to a selected memory block, in response to a first block select signal; and ground transistors configured to supply a first voltage to select lines, connected to unselected memory blocks, in response to a second block select signal. The pass transistors include gate structures, arranged in a first direction, and active regions arranged in the first direction. The ground transistors share a common gate structure and a common active region, and the common active region extends in a second direction, different from the first direction. A width of the common active region in the first direction is greater than a width of each of the active regions of the pass transistors in the second direction.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
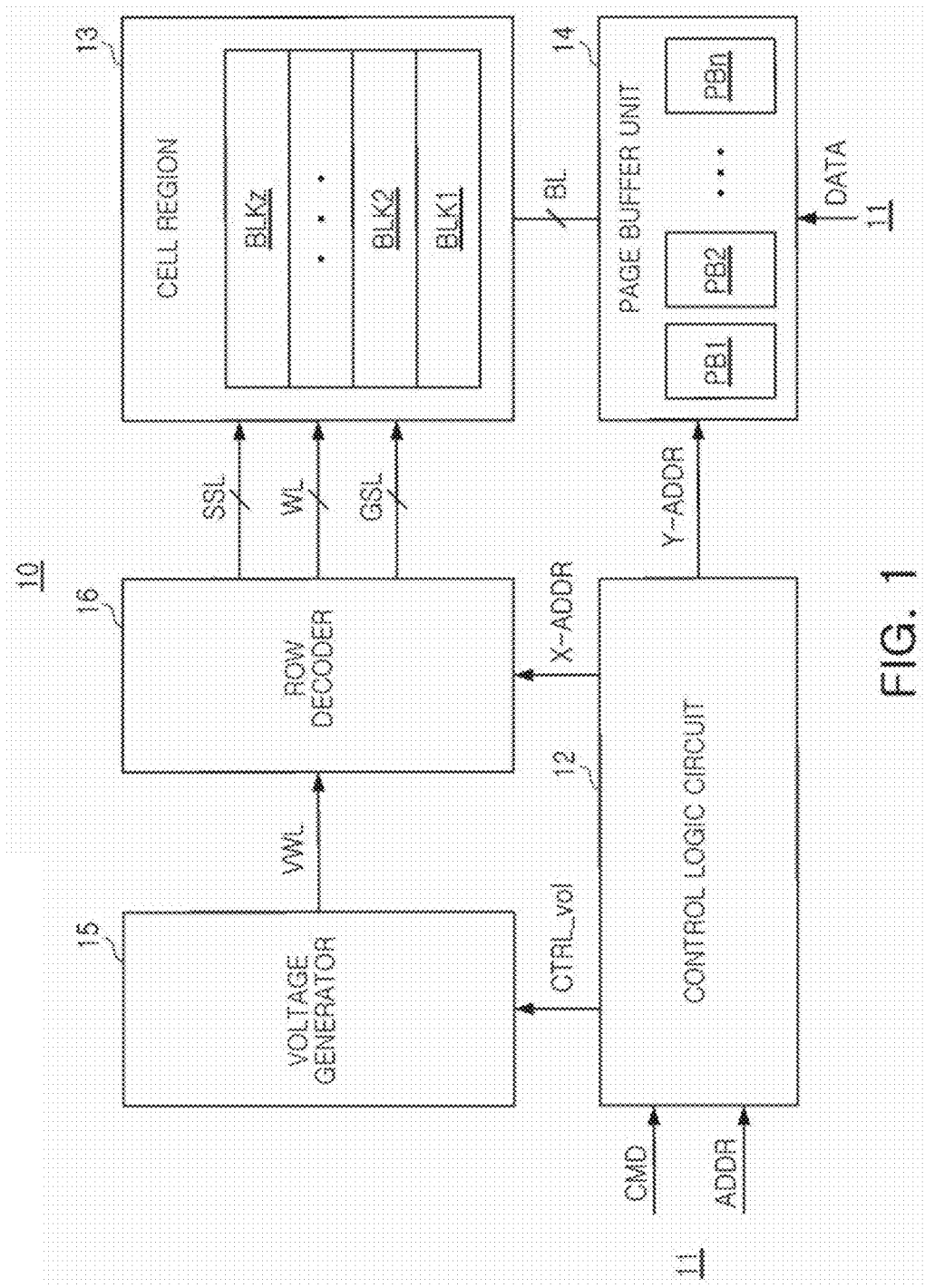
FIG. 1 is a schematic block diagram of a semiconductor device according to some example embodiments.

FIG. 1 is a schematic block diagram of a semiconductor device according to some example embodiments.

Referring to FIG. 1, a semiconductor device 10 may include a control logic circuit 12, a cell region 13, a page buffer unit 14, a voltage generator 15, and a row decoder 16. The semiconductor device 10 may further include an interface circuit 11, and may further include a column logic, a pre-decoder, a temperature sensor, a command decoder, an address decoder, a source driver, and the like. The semiconductor device 10 may be a memory device storing data. As an example, the semiconductor device 10 may be a non-volatile memory device retaining data stored therein, even when a power supply thereof is interrupted.

The control logic circuit 12 may overall control various operations in the semiconductor device 10. The control logic circuit 12 may output various control signals in response to a command CMD and/or an address ADDR from the interface circuit 11. For example, the control logic circuit 12 may output a voltage control signal CTRL_vol, a row address X-ADDR, and a column address Y-ADDR.

The cell region 13 may include a plurality of memory blocks BLK1 to BLKz (where "z" is a positive integer), and each of the plurality of memory blocks BLK1 to BLKz may include a plurality of memory cells. As an example, the plurality of memory blocks BLK1 to BLKz may include main blocks storing data, and at least one spare block storing data for an operation of the semiconductor device 10. The cell region 13 may be connected to the page buffer unit 14 through bitlines BL, and may be connected to the row decoder 16 through wordlines WL, string select lines SSL, and ground select lines GSL.

In some example embodiments, the cell region 13 may include a three-dimensional (3D) memory cell array, and the 3D memory cell array may include a plurality of memory cell strings. Each of the memory cell strings may include memory cells, respectively connected to wordlines vertically stacked on a substrate. U.S. Pat. Nos. 7,679,133, 8,553,466, 8,654,587, 8,559,235, and U.S. Patent Application Publication No. 2011/0233648 are incorporated herein by reference in their entirety. In some example embodiments, the cell region 13 may include a two-dimensional (2D) memory cell array, and the 2D memory cell array may include a plurality of memory cell strings arranged in row and column directions.

The page buffer unit 14 may include a plurality of page buffers PB1 to PBn (where "n" is an integer greater than or equal to 3), and the plurality of page buffers PB1 to PBn may be connected to the memory cells through a plurality of bitlines BL, respectively. The page buffer unit 14 may select at least one of the bitlines BL in response to the column address Y-ADDR. The page buffer unit 14 may operate as a write driver or a sense amplifier depending on an operation mode. For example, during a program operation, the page buffer unit 14 may apply a bitline voltage, corresponding to data to be programmed, to a selected bitline. During a read operation, the page buffer unit 14 may sense a current or a voltage on a selected bitline to sense data stored in a memory cell. Data to be programmed in the cell region 13 by a program operation and data read from the cell region 13 in a read operation may be input/output through the interface circuit 11.

The voltage generator 15 may generate various types of voltage for performing, read, and erase operations, based on the voltage control signal CTRL_vol. For example, the voltage generator 15 may generate a voltage, a read voltage, a pass voltage, a program verify voltage, an erase voltage, and the like. In some example embodiments, the control logic circuit 12 may control the voltage generator 15 to generate voltages for performing program, read, and erase operations using data stored in the spare block. Some of the voltages generated by the voltage generator 15 may be input to the wordlines WL as wordline voltages VWL by the row decoder 16, and some of the voltages generated by the voltage generator 15 may be input to a common source line by the source driver.

The row decoder 16 may select one of the plurality of wordlines WL in response to the row address X-ADDR. In addition, the row decoder 16 may select one of the plurality of string select lines SSL in response to the row address X-ADDR. For example, the row decoder 16 may apply a program voltage and a program verify voltage to a selected wordline during a program operation, and may apply a read voltage to a selected wordline during a read operation.

Figure 2:
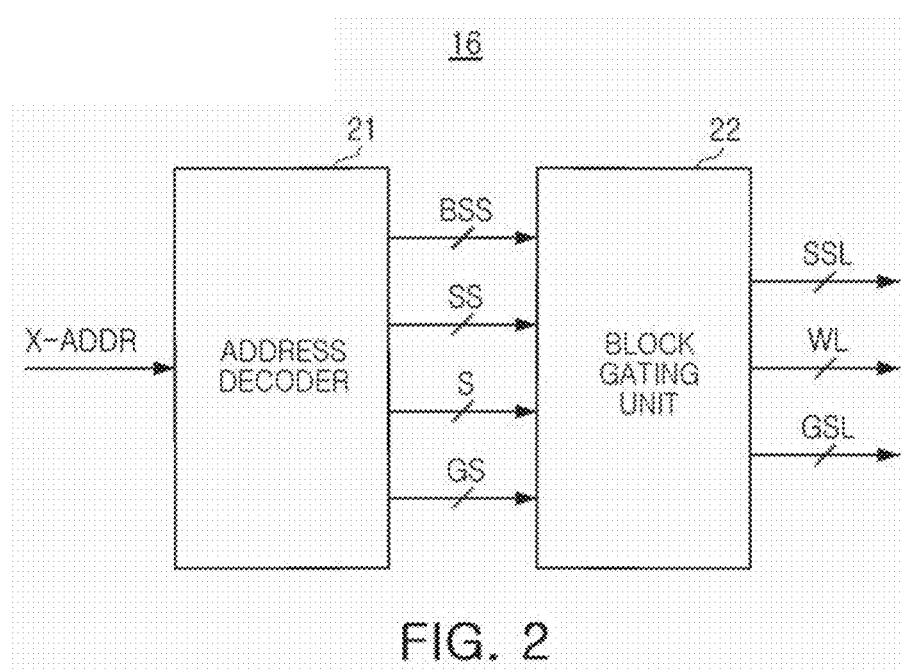
FIG. 2 is a block diagram illustrating a row decoder in greater detail.

FIG. 2 is a block diagram illustrating a row decoder in greater detail.

The row decoder 16 may include an address decoder 21 and a block gating unit 22. The row decoder 16 of FIG. 2 may correspond to the row decoder 16 described with reference to FIG. 1.

The block gating unit 22 may be connected to the cell region 13 through string select lines SSL, wordlines WL, and ground select lines GSL. The block gating unit 22 may be connected to the address decoder 21 through string lines SS, select lines S, and ground lines GS. The block gating unit 22 may receive a block select signal BSS from the address decoder 21.

The block gating unit 22 may select a memory block of the cell region 13 in response to the block select signal BSS. The block gating unit 22 may electrically connect string select lines SSL to the string lines SS, wordlines WL to the select lines, and ground select lines GSL to the ground lines GS.

The address decoder 21 may be connected to the block gating unit 22 through the string lines SS, the select lines S, and the ground lines GS. The address decoder 21 may operate in response to the control of the control logic circuit 12. The address decoder 21 may obtain the row address X-ADDR from the control logic circuit 12.

The address decoder 21 may output a block select signal BSS based on the row address X-ADDR. The address decoder 21 may select a select line, corresponding to the row address X-ADDR, among the select lines S. In addition, the address decoder 21 may select a string line and a ground line, corresponding to the row address X-ADDR, among the string lines SS and the ground lines GS.

Figure 3:
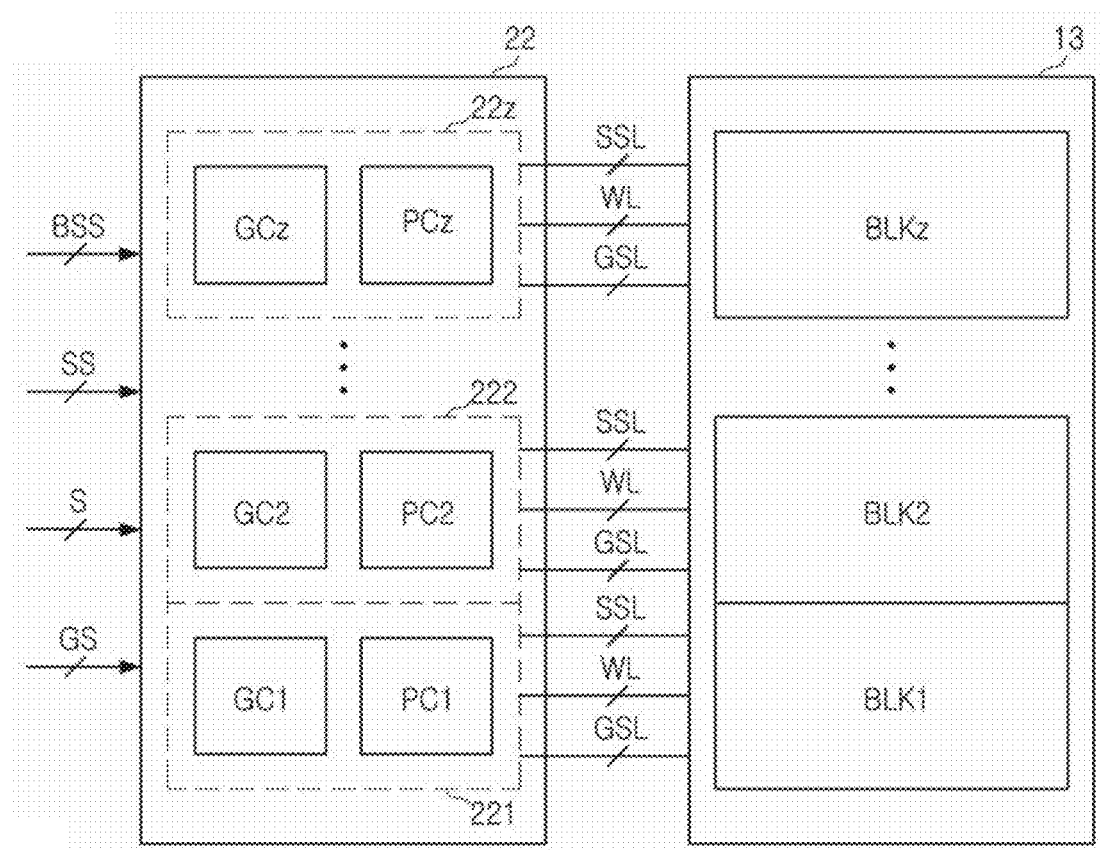
FIG. 3 is a diagram illustrating a block gating unit and a cell region in greater detail.

FIG. 3 is a diagram illustrating the block gating unit and the cell region, described with reference to FIGS. 1 and 2, in greater detail. Referring to FIG. 3, the cell region 13 may include a plurality of memory blocks BLK1 to BLKz. Each of the memory blocks BLK1 to BLKz may be connected to the block gating unit 22 through string select lines SSL, wordlines WL, and ground select lines GSL.

The block gating unit 22 may include a plurality of gating circuits 221 to 22z. The plurality of gating circuits 221 to 22z may correspond to the plurality of memory blocks BLK1 to BLKz, respectively. The plurality of gating circuits 221 to 22z may include a plurality of ground circuits GC1 to GCz and pass circuits PC1 to PCz, respectively. Each of the gating circuits 221 to 22z may include a single ground circuit and a single pass circuit.

Among the pass circuits PC1 to PCz, a pass circuit corresponding to the selected memory block may electrically connect string select lines SSL, wordlines WL, and a ground select line GSL of the selected memory block to the string select lines SSL, the select lines S, and the ground line GS in response to a block select signal BSS.

Among the ground circuits GC1 to GCz, a ground circuit corresponding to unselected memory blocks may supply a low voltage to string select lines SSL, wordlines WL, and a ground select line GSL of each of the unselected memory blocks. For example, the ground circuits GC1 to GCz may supply a ground voltage VSS.

Figure 4:
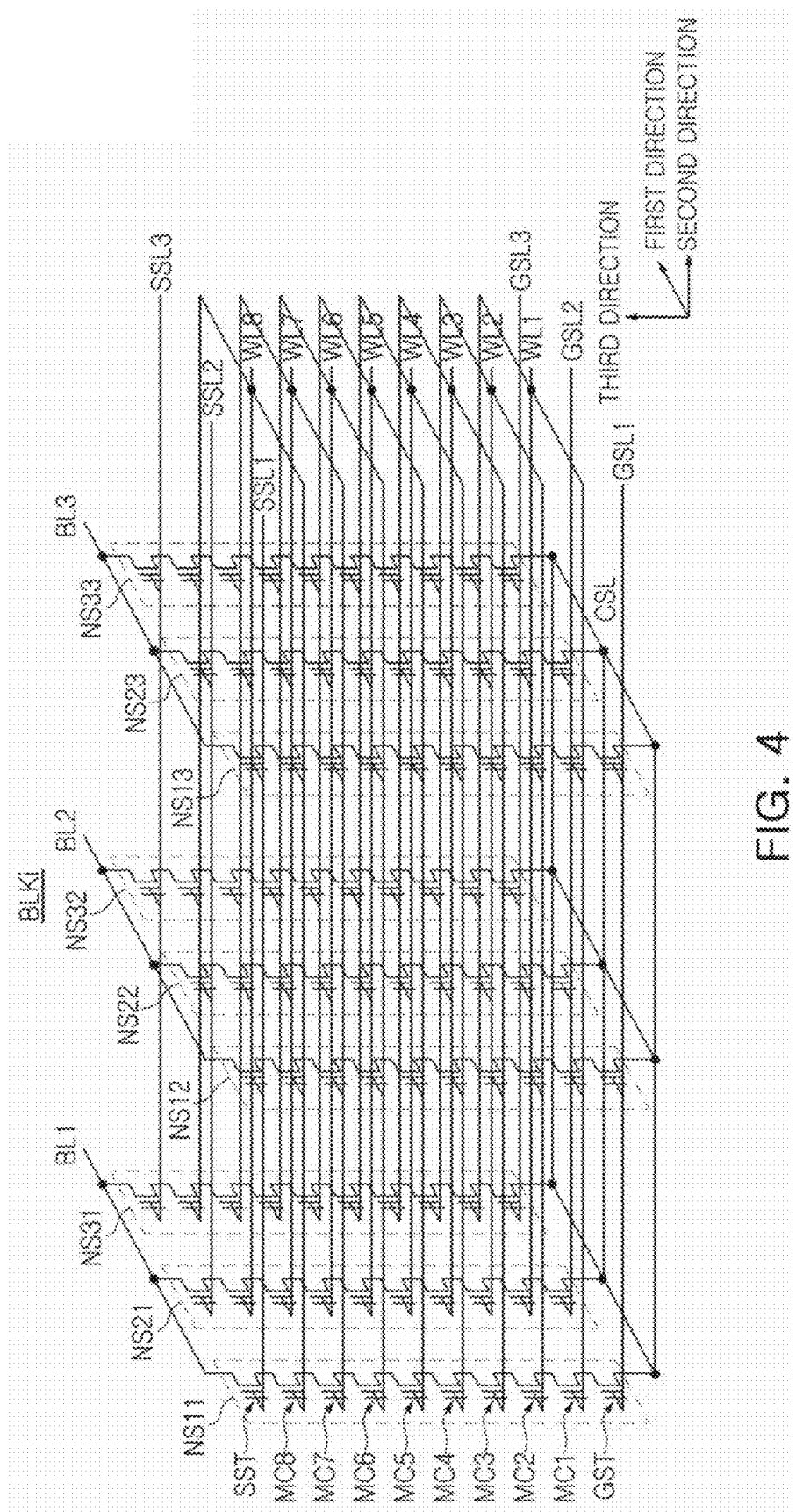
FIG. 4 is a schematic circuit diagram of a memory block of a semiconductor device according to some example embodiments.

FIG. 4 is a schematic circuit diagram of a memory block of a semiconductor device according to some example embodiments.

A memory block BLKi, illustrated in FIG. 4, represents a three-dimensional (3D) memory block formed to have a three-dimensional structure on a substrate. For example, a plurality of memory cell strings included in the memory block BLKi may be formed in a direction, perpendicular to the substrate.

Referring to FIG. 4, the memory block BLKi may include a plurality of NAND strings NS11 to NS33 connected between bitlines BL1 to BL3 and a common source line CSL. Each of the plurality of NAND strings NS11 to NS33 may include a string select transistor SST, a plurality of memory cells MC1 to MC8, and a ground select transistor GST. In FIG. 4, each of the plurality of NAND strings NS11 to NS33 are illustrated as including eight memory cells MC1 to MC8, but example embodiments are not limited thereto.

The string select transistor SST may be connected to a corresponding string select line, among the string select lines SSL1 to SSL3. The plurality of memory cells MC1 to MC8 may be connected to corresponding wordlines WL1 to WL8, respectively. According to example embodiments, at least one of the wordlines WL1 to WL8 may be provided as a dummy wordline. The ground select transistor GST may be connected to a corresponding ground select line, among the ground select lines GSL1 to GSL3. The string select transistor SST may be connected to a corresponding bitline, among the bitlines BL1 to BL3, and the ground select transistor GST may be connected to the common source line CSL.

Wordlines (for example, WL1) having the same height may be commonly connected, and the ground select lines GSL1 to GSL3 and the string select lines SSL1 to SSL3 may be separated from each other. In FIG. 4, the memory block BLKi is illustrated as being connected to the eight wordlines WL1 to WL8 and three bitlines BL1 to BL3, but example embodiments are not limited thereto.

Figure 5:
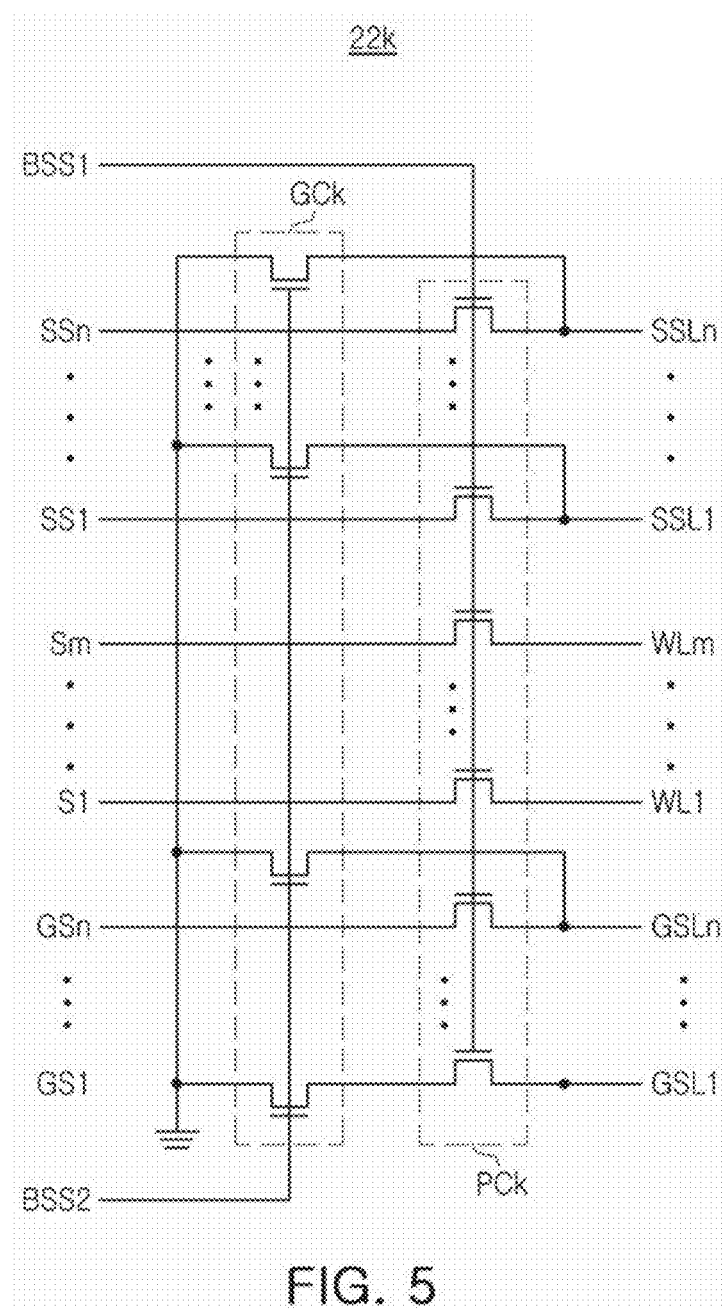
FIG. 5 is a circuit diagram of a gating circuit.

FIG. 5 is a circuit diagram of a gating circuit.

A gating circuit 22k, illustrated in FIG. 5, may correspond to one of the gating circuits 221 to 22z described with reference to FIG. 3. Referring to FIG. 5, the gating circuit 22k may include a pass circuit PCk and a ground circuit GCk.

The pass circuit PCk may include a plurality of pass transistors. The plurality of pass transistors may connect string select lines SSL1 to SSLn, wordlines WL1 to WLm, and ground select lines GSL1 to GSLn to string lines SS1 to SSn, select lines S1 to Sm, and ground lines GS1 to GSn in response to a first block select signal BSS1, respectively. For example, pass transistors may be high-voltage transistors.

The ground circuit GCk may include a plurality of ground transistors. The ground transistors may supply a low voltage to the string select lines SSL1 to SSLn and the ground select lines GSL1 to GSLn in response to a second block select signal BSS2. For example, the ground transistors may supply a ground voltage VSS.

An activated first block select signal BSS1 may be supplied to a pass circuit corresponding to the selected memory block, among the plurality of memory blocks BLK1 to BLKz. An activated second block select signal BSS2 may be supplied to ground circuits corresponding to unselected memory blocks, among the plurality of memory blocks BLK1 to BLKz. For example, string select lines SSL1 to SSLn, wordlines WL1 to WLm, and ground select lines GSL1 to GSLn of the selected memory block may be connected to the address decoder 21. The ground voltage VSS may be supplied to the string select lines SSL1 to SSLn and the ground select lines GSL1 to GSLn of the unselected memory blocks, and the wordlines WL1 to WLm may be floated. Accordingly, the unselected memory blocks may be separated from the bitlines BL and the common source line CSL.

Figure 6:
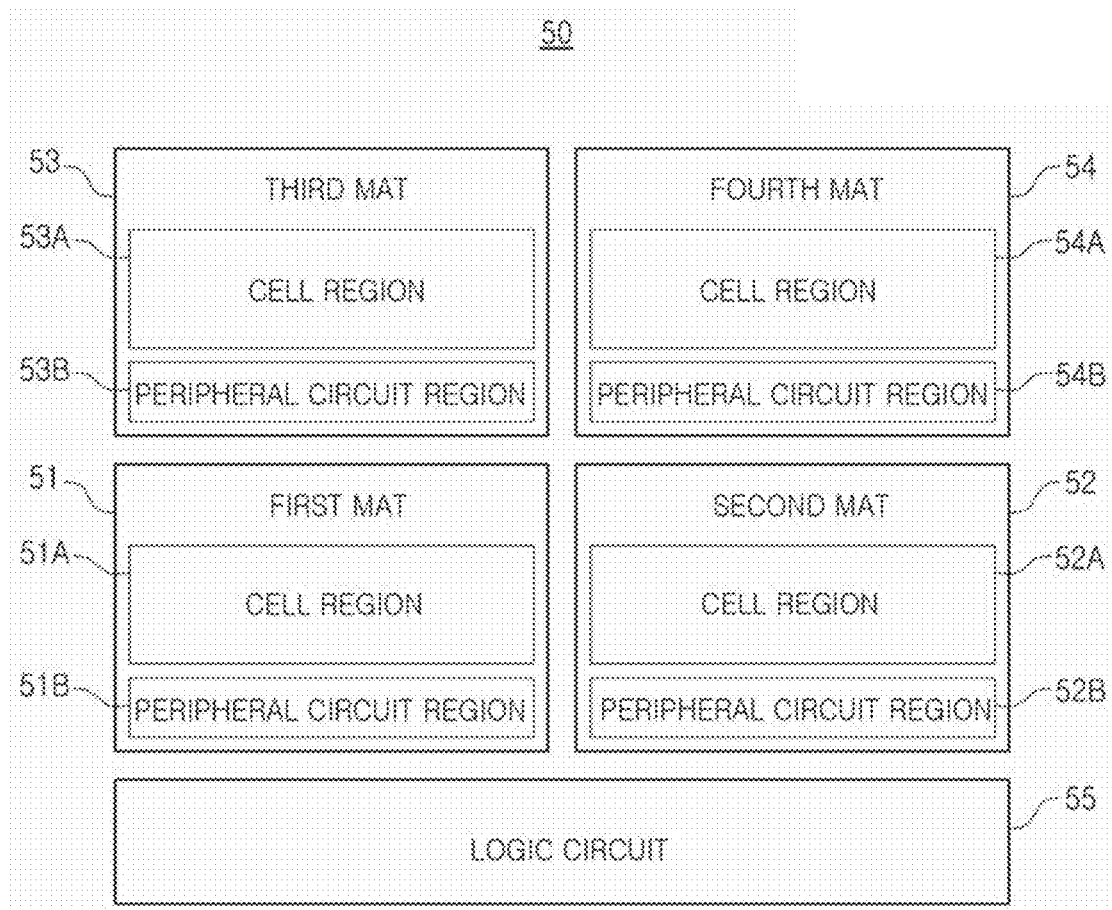
FIG. 6 is a schematic diagram illustrating a structure of a semiconductor device according to some example embodiments.

FIG. 6 is a schematic diagram illustrating a structure of a semiconductor device according to some example embodiments.

Referring to FIG. 6, a semiconductor device 50 according to some example embodiments may include a plurality of mats 51 to 54 and a logic circuit 55. For example, each of the plurality of mats 51 to 54 may include the cell region 13, the page buffer unit 14, and the row decoder 16 described with reference to FIG. 1, and the logic circuit 55 may include a control logic circuit 12 and a voltage generator 15, and the like.

According to some example embodiments, each of the plurality of mats 51 to 54 may operate independently of each other. For example, while the first mat 51 performs a program operation to write data received from an external memory controller, the logic circuit 55 may read data stored in the second mat 52 and may output the read data to an external entity.

Each of the plurality of mats 51 to 54 may include a cell region and a peripheral circuit region. The cell region may include memory cells, and the peripheral circuit region may include circuits for controlling the cell region, for example, a row decoder, a page buffer unit, and the like.

In some example embodiments, a cell region of each of the plurality of mats 51 to 54 may include a plurality of blocks. As described above, the plurality of blocks may include main blocks storing data and outputting data in response to a command from the logic circuit 55, and a spare block storing data for an operation of the semiconductor device 50.

Figure 7:
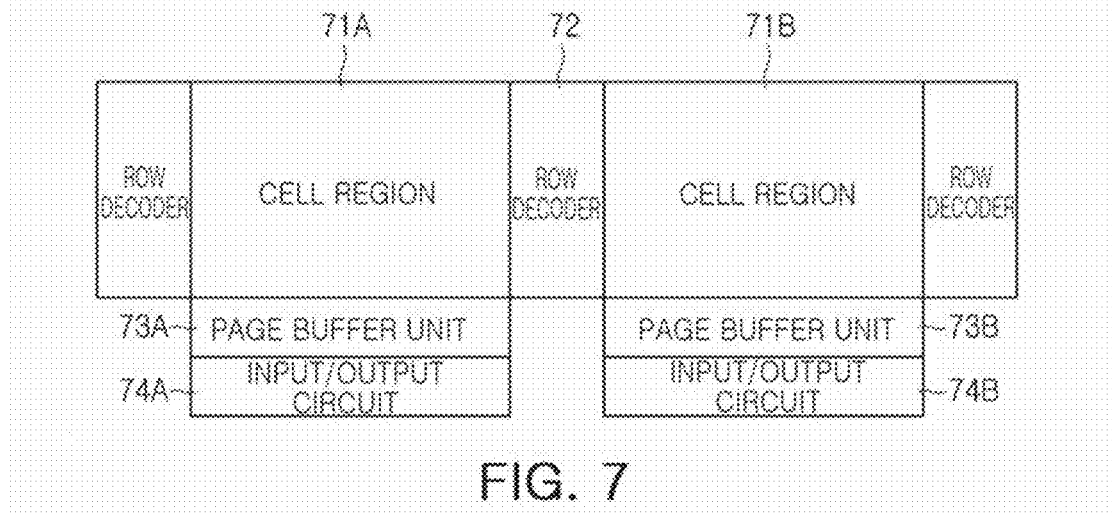
FIG. 7 is a diagram illustrating arrangements of a cell region and a peripheral circuit region in one mat, among mats included in a semiconductor device according to some example embodiments.

FIG. 7 may be a diagram illustrating arrangements of a cell region and a peripheral circuit region in one of mats included in the semiconductor device 70 according to some example embodiments. Referring to FIG. 7, a peripheral circuit region may be disposed around the cell regions 71A and 71B. For example, the row decoder 72 may be disposed on opposite sides adjacent to each of the cell regions 71A and 71B. The page buffers 73A and 73B may be disposed below each of the cell regions 71A and 71B. The page buffers 73A and 73B may be connected to a logic circuit, controlling overall operations of the semiconductor device 70, and an input/output interface, in communication with an external device, through input/output circuits 74A and 74B.

For example, wordlines included in each of the cell regions 71A and 71B may extend in a horizontal direction to be connected to the row decoder 72 adjacent to the cell regions 71A and 71B. On the other hand, bitlines included in each of the cell regions 71A and 71B may extend in a vertical direction to be connected to the page buffers 73A and 73B disposed below each of the cell regions 71A and 71B. In the example embodiments illustrated in FIG. 7, the cell regions 71A and 71B, the row decoder 72, the page buffers 73A and 73B, and the input/output circuits 74A and 74B may be formed on a single substrate.

Figure 8:
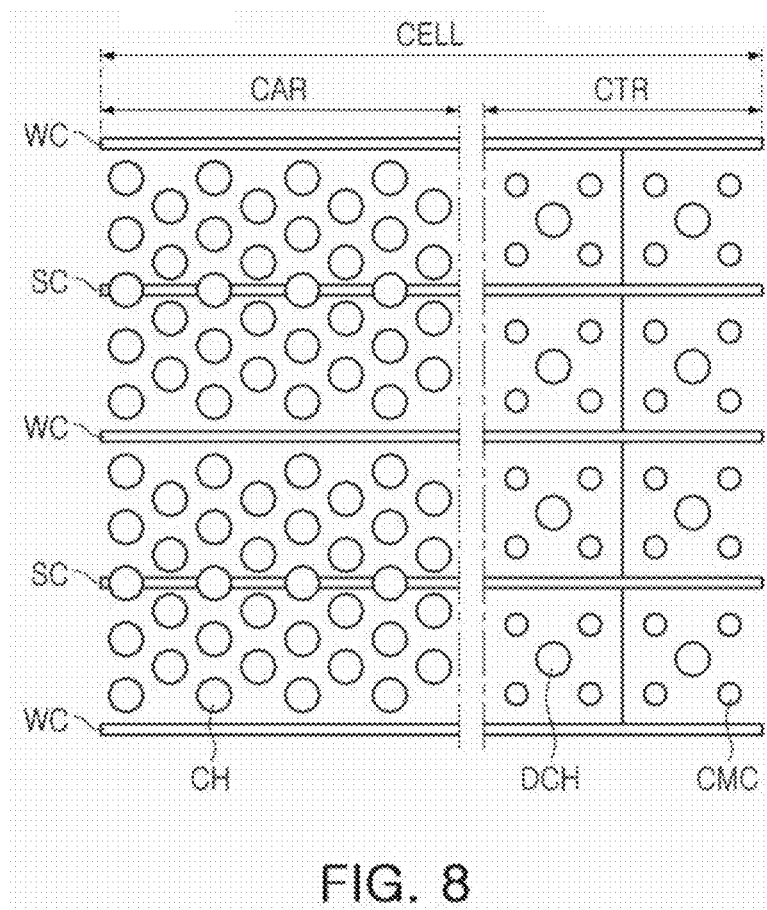
FIG. 8 is a diagram illustrating a structure of a semiconductor device according to some example embodiments.

FIG. 8 is a diagram illustrating a structure of a semiconductor device according to some example embodiments.

FIG. 8 may be a plan view illustrating the cell region CELL in the semiconductor device according to the example embodiments described with reference to FIG. 7.

Referring to FIG. 8, the cell region CELL may include a cell array region CAR and a cell contact region CTR. A plurality of channel structures CH may be disposed in the cell array region CAR. The plurality of channel structures CH may be disposed between adjacent wordline cuts WC.

The channel structures CH may be formed in a direction, perpendicular to the substrate, to form memory cell strings. The memory cell strings may be selected by a string select signal provided through a string select line. Each string select line may be separated by string select line cuts SC.

Cell contacts CMC may be disposed in the cell contact region CTR. In the example embodiments illustrated in FIG. 8, the cell contact region CTR may be disposed between the cell array region CAR and the peripheral circuit region.

The peripheral circuit region may include pass transistors and ground transistors. As described with reference to FIG. 5, the pass transistors may be connected to string select lines SSL, wordlines WL, and ground select lines GSL. The pass transistors, connected to a selected memory block, may supply voltages to drive the string select lines SSL, the wordlines WL, and the ground select lines GSL in response to a first block select signal BSS1. The pass transistors may supply a relatively high voltage. For example, pass transistors connected to the wordlines WL may supply a voltage of a maximum of about 20 volts to the wordlines WL for a program operation. Accordingly, the pass transistor may be implemented as a high-voltage device.

The ground transistors may be connected to a string select lines SSL and a ground select line GSL. Ground transistors, connected to unselected memory block, may supply a low voltage, for example, a ground voltage VSS of about 0 volt to 2 volts, to the string select lines SSL and the ground select line GSL in response to a second block select signal BSS2. Accordingly, the ground transistors may be implemented as low-voltage devices. A high voltage may be greater than a low voltage, for example, greater than 2 volts.

The low-voltage device may be formed to have a size smaller than that of the high-voltage device. For example, each of the ground transistors may be formed to have a size smaller than that of each of the pass transistors. When the ground transistors have a structure similar to that of the pass transistors and are arranged side by side with the pass transistors, integration density of the semiconductor device may be decreased.

According to some example embodiments, adjacent ground transistors may be formed to share a common active region with a common gate structure, and thus, an area occupied by the ground transistors may be reduced and performance of the semiconductor device may be improved. In addition, the ground transistors may be disposed in a direction, different from that of the ground transistors, to further improve the integration density of the semiconductor device.

Hereinafter, a peripheral circuit region according to some example embodiments will be described in detail with reference to FIGS. 9 to 17.

Figure 9:
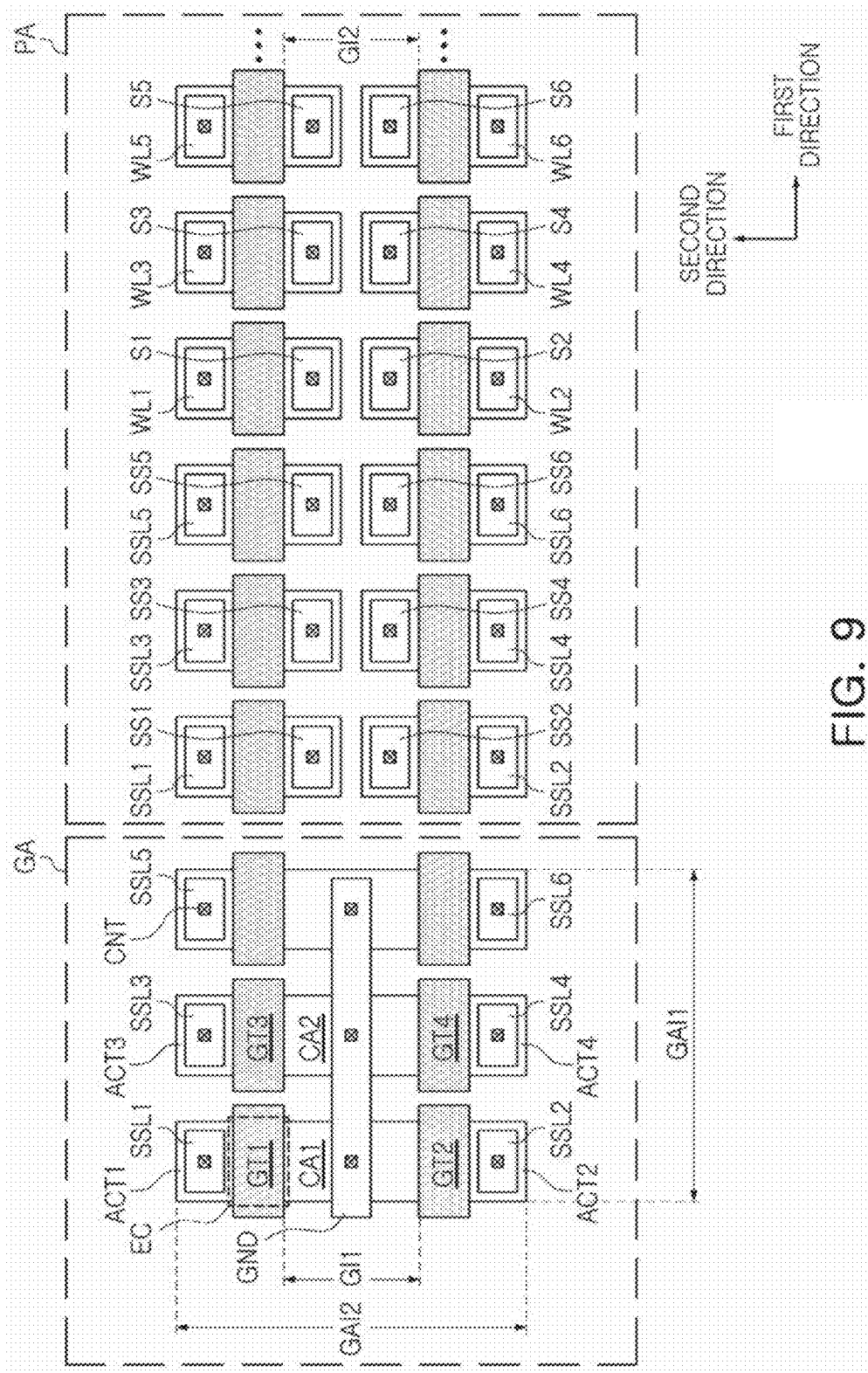
FIG. 9 is a diagram illustrating devices disposed in a peripheral circuit region of a semiconductor device in a comparative example, different from some example embodiments.

FIG. 9 is a diagram illustrating devices disposed in a peripheral circuit region of a semiconductor device according to a comparative example, different from some example embodiments.

The peripheral circuit of the semiconductor device according to the comparative example may include a block gating unit. The block gating unit may include a ground region GA and a pass region PA. The ground region GA may include a plurality of ground transistors arranged in first and second directions, and the pass region PA may include a plurality of pass transistors arranged in the first and second directions.

Each of the plurality of pass transistors may be connected to select lines and wordlines. In the example of FIG. 9, pass transistors connecting the string select lines SSL1 to SSL6 and the string lines SS1 to SS6 to each other and connecting the wordlines WL1 to WL6 and the select lines S1 to S6 to each other are illustrated. Each of the pass transistors may include a plurality of individual active regions.

The ground transistors may be arranged side by side with the pass transistors. Each of a plurality of ground transistors may be connected to select lines. In the example of FIG. 9, the ground transistors connected to the plurality of string select lines SSL1 to SSL6 are illustrated. In a comparative example, the ground transistors may form a pair. For example, a first ground transistor including a first gate structure GT1 and a second ground transistor including the second gate structure GT2 may form a pair. The first and second ground transistors may share a first common active region CA1. The first common active region CA1 may be connected to the ground GND through a contact CNT.

The ground transistors, forming a pair, may further include individual active regions different from the first common active region CA1. The first ground transistor may further include a first active region ACT1 different from the first common active region CA1, and the second ground transistor may further include a second active region ACT2 different from the first common active region CA1. The first active region ACT1 may be connected to the first string select line SSL1, and the second active area ACT2 may be connected to the second string select line SSL2.

When a block select signal is applied to the first gate structure GT1, an effective channel EC may be formed between the first active region ACT1 and the first common active region CA1 such that current may flow. When the effective channel EC is formed, the first string select line SSL1 may be discharged while the first string select line SSL1 is connected to the ground GND. At the same time, the block select signal may also be applied to the second gate structure GT2. When the block select signal is applied to the second gate structure GT2, the second string select line SSL2 may also be discharged.

In a comparative example, another pairs of ground transistors may be separated from each other. For example, active regions and gate structures of the first ground transistor, connected to the first string select line SSL1, and the third ground transistor, connected to the third string select line SSL3, may be separated from each other. According to the comparative example, since a gap between another pair of ground transistors should be sufficiently secured, a width GAI1 of the ground region in a first direction may be increased and the integration density of the semiconductor device may be decreased.

According to some example embodiments, adjacent ground transistors may be formed to share a common gate structure and a common active region, and thus, a width GAI1 of the ground region in a first direction may be reduced and integration density of the semiconductor device may be improved. In addition, the common gate structure may extend between individual active regions of adjacent ground transistors. When the common gate structure extends between the individual active regions, an area of an effective channel in contact with the individual active regions may be increased and performance of the semiconductor device may be improved.

In addition, according to some example embodiments, a low voltage, such as a ground voltage VSS, may be applied to the common active region of the ground transistor, so that the common active region may be implemented to occupy a small area as compared with individual active region of the pass transistor. Accordingly, a first gate interval GI1 of the ground transistor may be reduced to be smaller than the second gate interval GI2 of the pass transistor, so that a width GAI2 of the ground region in a second direction may be reduced. According to example embodiments, the ground region GA having a reduced area may be disposed in a direction, different from that of the pass region PA, to further improve the integration density of the semiconductor device.

Figure 10:
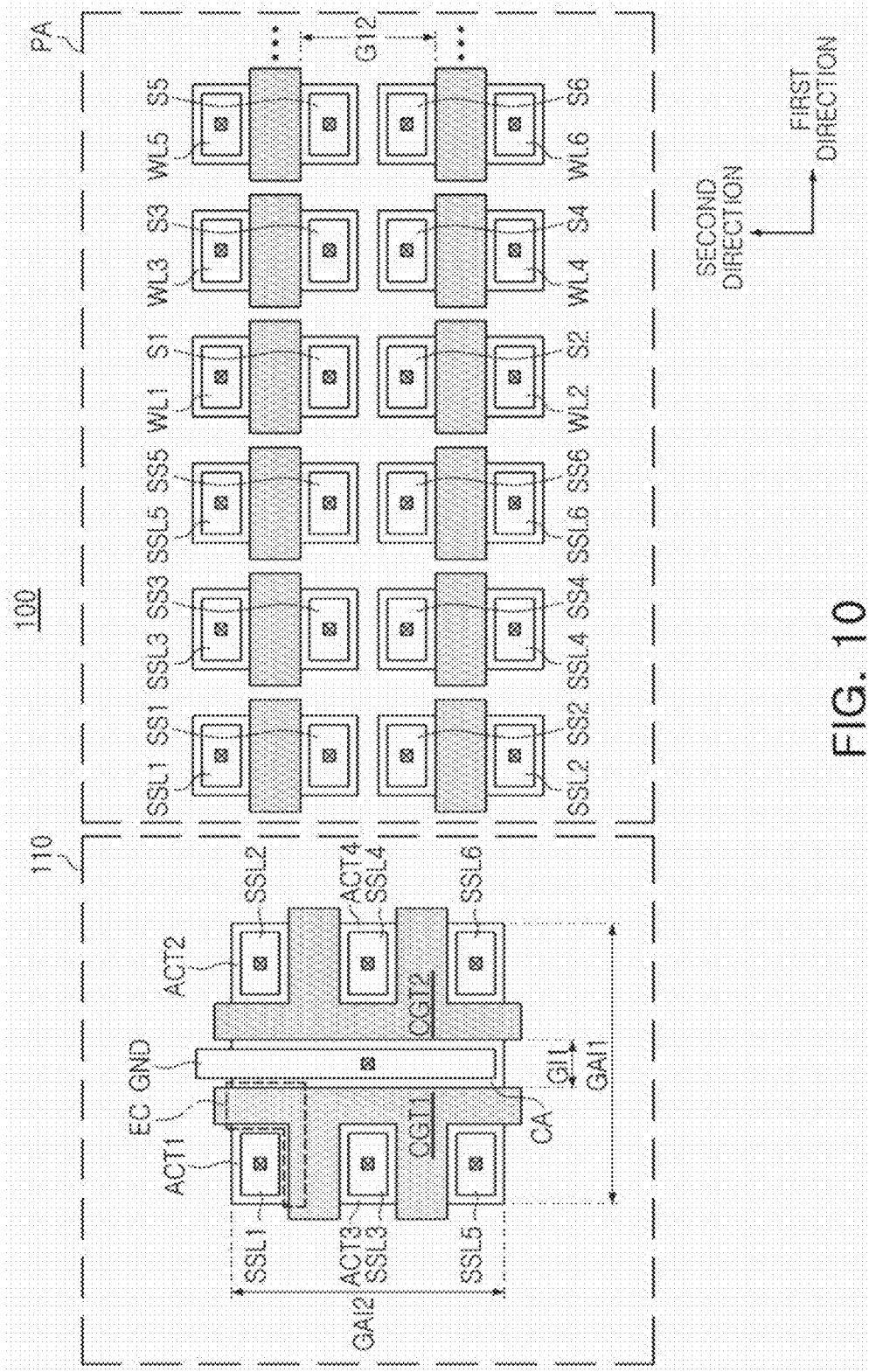
FIGS. 10 to 11D are diagrams illustrating devices disposed in a peripheral circuit region of a semiconductor device according to some example embodiments.

FIG. 10 is a diagram illustrating devices disposed in a peripheral circuit region of a semiconductor device according to some example embodiments.

A semiconductor device 100 according to some example embodiments may include a block gating unit. The block gating unit may correspond to the block gating unit 22 described with reference to FIGS. 2 to 3.

The block gating unit may include a ground region 110 and a pass region PA. The ground region 110 may include a plurality of ground transistors, and the pass region PA may include a plurality of pass transistors. The pass transistors of the pass region PA illustrated in FIG. 10 may have a structure, similar to the pass transistors of the pass region PA illustrated as a comparative example of FIG. 9, and may be arranged similarly thereto.

The plurality of ground transistors, included in the ground region 110, may be connected to select lines, respectively. In the example of FIG. 10, ground transistors connected to the string select lines SSL1 to SSL6 are illustrated. The ground transistors, connected to the string select lines SSL1 to SSL6, may be referred to as first to sixth ground transistors, respectively.

According to some example embodiments, the first to sixth ground transistors may share a common active region CA connected to a ground GND. Each of the first to sixth ground transistors may further include an individual active region connected to the select lines.

The first, third, and fifth ground transistors may share a first common gate structure CGT1 connected to the block select signal. The first common gate structure CGT1 may be disposed between individual active regions of the first, third, and fifth ground transistors and the common active region CA. The first common gate structure CGT1 may extend between the individual active regions of the first, third, and fifth ground transistors. Similarly, the second, fourth, and sixth ground transistors may share a second common gate structure CGT2 connected to the block select signal. The second common gate structure CGT2 may be disposed between individual active regions of the second, fourth, and sixth ground transistors and the common active region CA. The second common gate structure CGT2 may extend between the individual active regions of the second, fourth, and sixth ground transistors.

According to some example embodiments, since the ground transistors may share a common active region and a common gate structure, a gap between the ground transistors may be reduced and integration density of the semiconductor device 100 may be improved, as compared to the comparative example.

According to some example embodiments, the common gate structure may extend between individual active regions of the ground transistors. When the common gate structure extends between the individual active regions, an area in which the individual active regions are in contact with the gate structure may be increased. As a result, a width of an effective channel EC may be increased. When the width of the effective channel EC is increased, the current may flow smoothly between the active regions of the ground transistor, so that a voltage applied to the select line may be rapidly discharged. Accordingly, electrical characteristics of the semiconductor device 100 may also be improved.

According to some example embodiments, the ground transistors and the pass transistors may be arranged in different directions to improve the integration density of the peripheral circuit region more effectively. In the example of FIG. 10, unlike the pass transistors arranged in the first direction, the common active region CA of the ground transistors may extend in the second direction to allow the ground transistors to be arranged in the second direction.

Since the pass transistor may be implemented as a high-voltage device, there may be a limitation in reducing the second gate interval GI2 of the pass transistor. When the ground transistors and the pass transistors are arranged in the same direction, it may be difficult to effectively reduce a length of the peripheral circuit region in the second direction in spite of reduction of the first gate interval GI1. According to some example embodiments, the common active region CA may extend in the second direction to reduce the length of the peripheral circuit region in the first direction, rather than the length of the peripheral circuit region in the second direction, so that a rectangular area of the peripheral circuit region may be effectively reduced.

Although an example of the ground region 110 including six ground transistors is illustrated in FIG. 10, the number and arrangement of ground transistors included in the ground region are not limited to the example of FIG. 10. Hereinafter, examples of ground regions including various numbers of ground transistors having various arrangements will be described with reference to FIGS. 11A to 17.

FIGS. 11A to 11D are diagrams illustrating devices disposed in a peripheral circuit region of a semiconductor device according to some example embodiments.

Figure 11A:
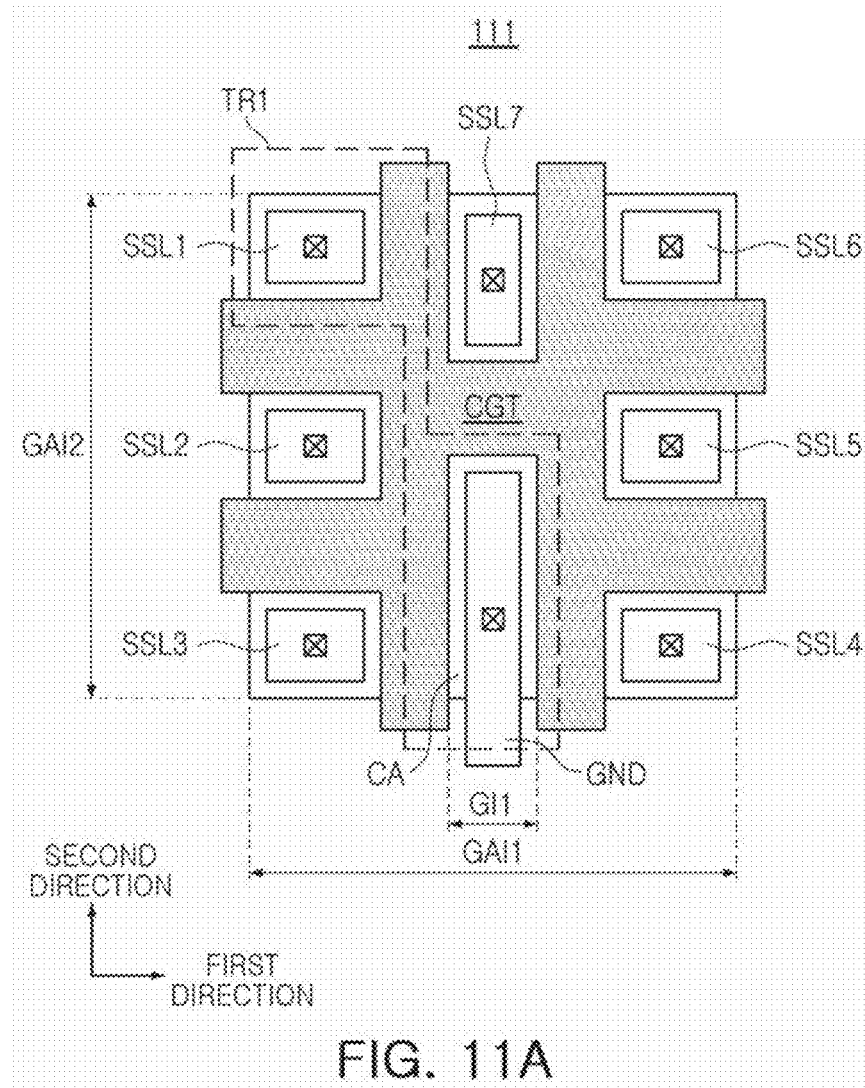

Referring first to FIG. 11A, a semiconductor device 100 may include a ground region 111.

A plurality of ground transistors, included in the ground region 111, may each be connected to select lines. FIG. 11A illustrates the case in which seven string select lines SSL1 to SSL7 are connected to ground transistors. The ground transistors connected to the string select lines SSL1 to SSL7 may be referred to as first to seventh ground transistors, respectively. For example, a region corresponding to the first transistor TR1 is represented by dashed lines.

According to some example embodiments, the first to seventh ground transistors may share a common active region CA connected to a ground GND. Each of the first to seventh ground transistors may further include an individual active region connected to the string select lines SSL1 to SSL7. The first to seventh ground transistors may share a common gate structure CGT connected to a block select signal. The common gate structure CGT may extend between the individual active regions of the first to seventh ground transistors. When the block select signal is applied to the common gate structure CGT, the voltage applied to the string select lines SSL1 to SSL7 through the first to seventh ground transistors may be discharged through the ground GND.

According to some example embodiments, a plurality of ground transistors may be disposed to surround three surfaces of the common active region CA. Since the plurality of ground transistors may share the common gate structure CGT and the common active region CA, integration density of the semiconductor device 100 may be improved.

Figure 11B:
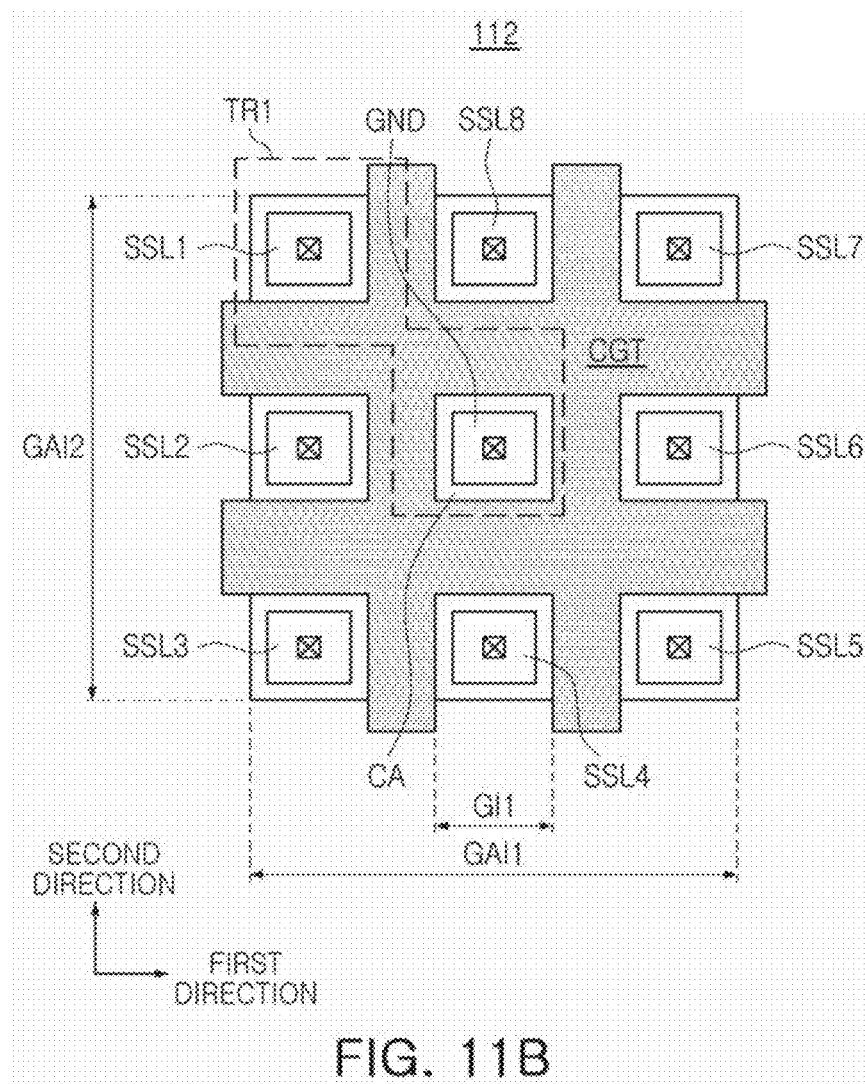

Referring to FIG. 11B, a semiconductor device 100 may include a ground region 112.

FIG. 11B illustrates the case in which eight string select lines SSL1 to SSL8 are connected to ground transistors. Ground transistors connected to the string select lines SSL1 to SSL8 may be referred to as first to eighth ground transistors, respectively. As an example, in FIG. 11B, a region corresponding to the first transistor TR1 is represented by dashed lines.

According to some example embodiments, a plurality of ground transistors may be disposed to surround four surfaces of a common active region CA. The first to eighth ground transistors may share a common active region CA disposed in a center thereof, and may further share a common gate structure CGT surrounding the common active region CA. Since the ground transistors may share the common gate structure CGT and the common active region CA, integration density of the semiconductor device 100 may be improved.

Figure 11C:
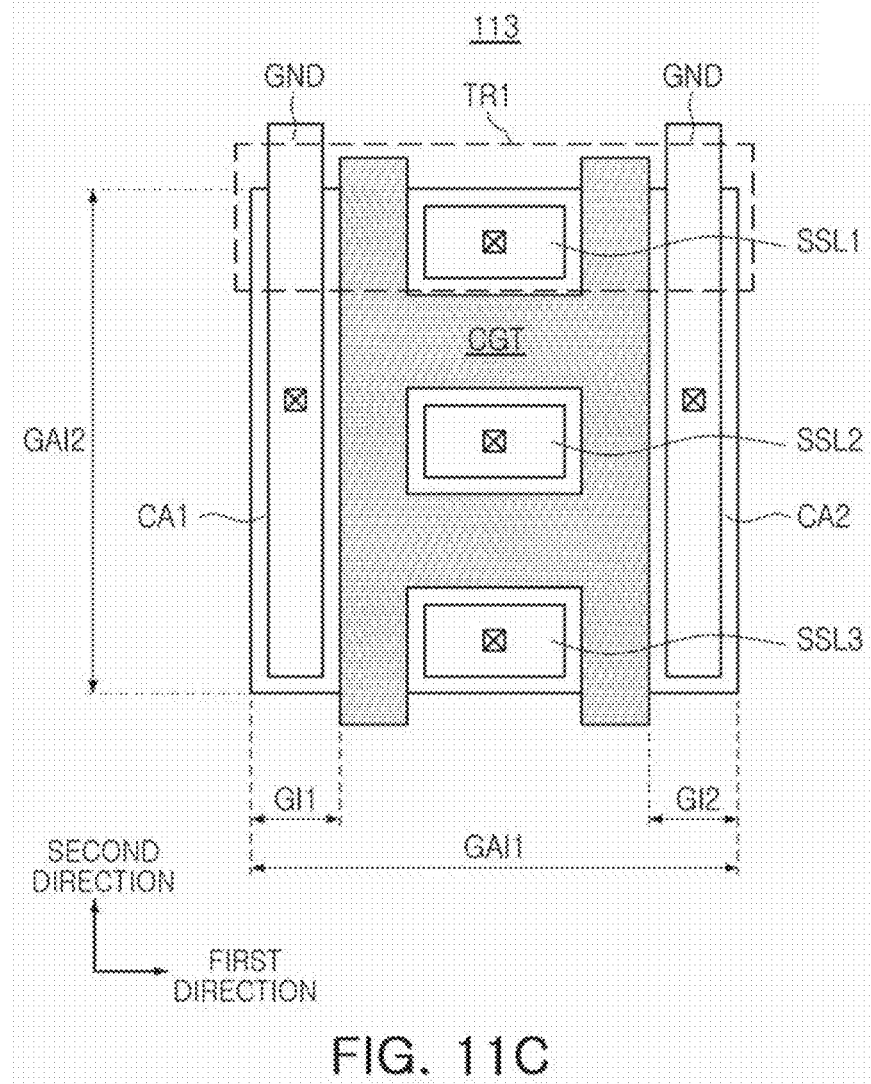

Referring to FIG. 11C, a semiconductor device 100 may include a ground region 113.

FIG. 11C illustrates the case in which three string select lines SSL1 to SSL3 are connected to ground transistors. Ground transistors connected to the string select lines SSL1 to SSL3 may be referred to as first to third ground transistors, respectively. For example, in FIG. 11C, a region corresponding to the first transistor TR1 is represented by dashed lines.

According to some example embodiments, a plurality of ground transistors may share a plurality of common active regions. For example, the first to third ground transistors may share the first and second common active regions CA1 and CA2 connected to the ground GND. The first to third ground transistors may further share a common gate structure CGT connected to a block select signal. When the block select signal is applied to the common gate structure CGT, voltages applied to the first to third string select lines SSL1 to SSL3 may be discharged through the first and second common active regions CA1 and CA2.

According to some example embodiments, the common gate structure CGT may be formed to surround three or four surfaces of individual active regions of the ground transistors, and the common gate structure CGT may be connected to a plurality of common active regions CA1 and CA2. Accordingly, a width of an effective channel of each ground transistor may be increased to rapidly discharge the voltages applied to the string select lines.

Figure 11D:
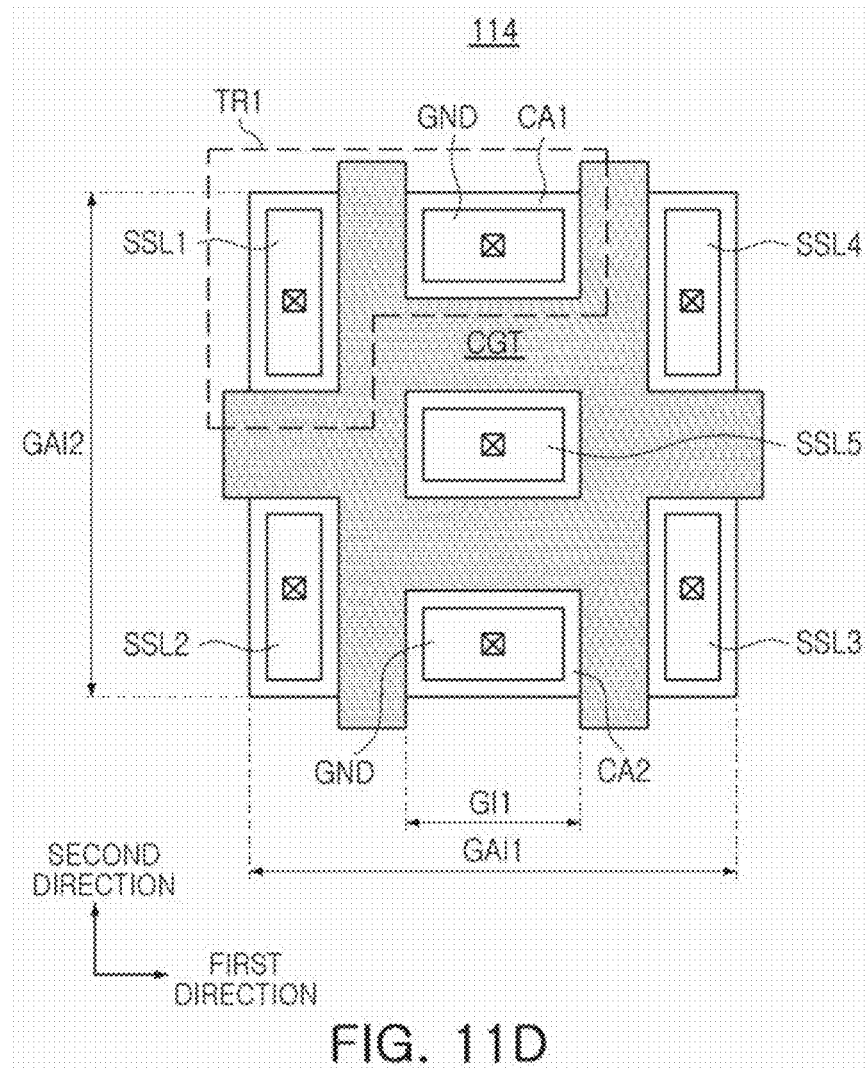

Referring to FIG. 11D, a semiconductor device 100 may include a ground region 114.

FIG. 11D illustrates the case in which five string select lines SSL1 to SSL5 are connected to ground transistors. Ground transistors connected to the string select lines SSL1 to SSL5 may be referred to as a first to fifth ground transistors, respectively. For example, in FIG. 11D, a region corresponding to the first transistor TR1 is represented by dashed lines.

According to some example embodiments, a plurality of ground transistors may share a plurality of active regions. For example, the first to fifth ground transistors may share first and second common active regions CA1 and CA2. The first to fifth ground transistors may further share a common gate structure CGT connected to a block select signal. When the block select signal is applied to the common gate structure CGT, voltages applied to the first to fifth string select lines SSL1 to SSL5 may be discharged through the first and second common active regions CA1 and CA2.

According to the example embodiments described with reference to FIGS. 10 to 11D, a plurality of ground transistors may include one or more common gate structures and one or more common active regions. The ground transistors may further include individual active regions. The common gate structure may include a first region, extending in a first direction between the common active region and the individual active regions, and a second region extending in a second direction, intersecting the first direction, between the common active region and the individual active regions.

Figure 12:
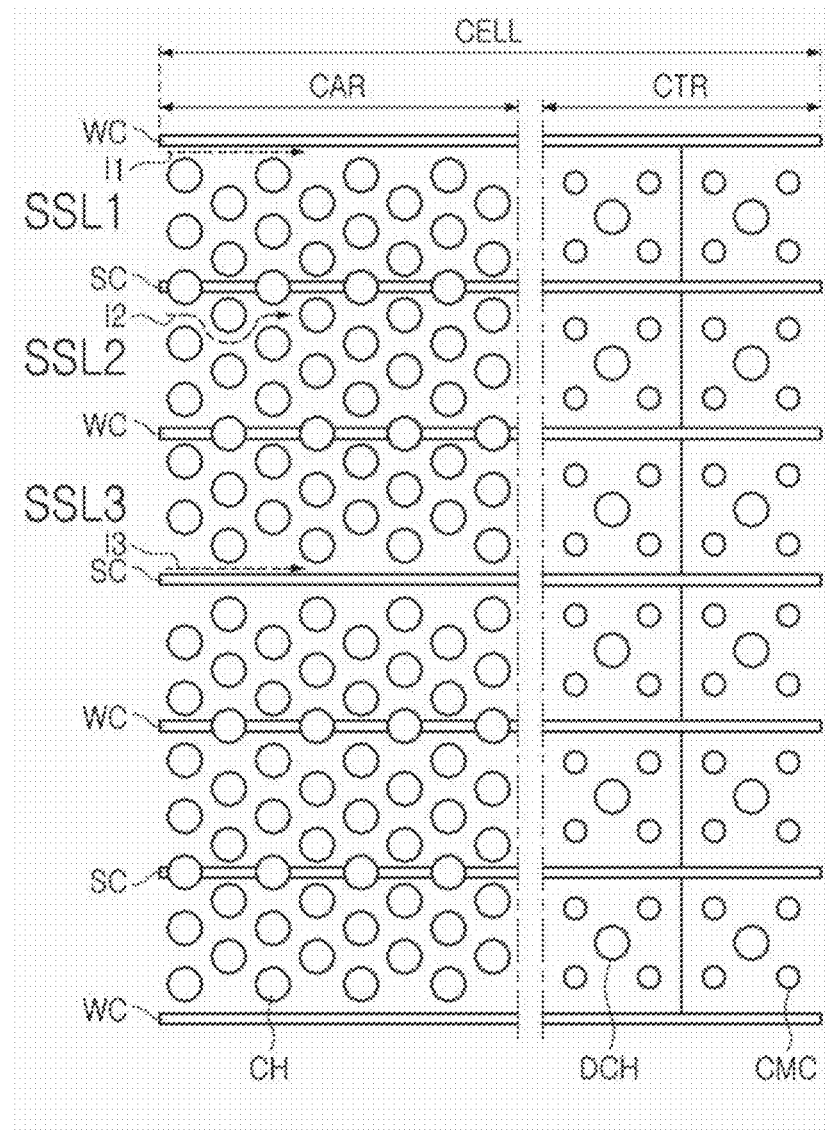
FIG. 12 is a diagram illustrating a structure of a semiconductor device according to some example embodiments.

FIG. 12 is a diagram illustrating a structure of a semiconductor device according to some example embodiments.

FIG. 12 may be a plan view illustrating a portion of the cell region CELL in the semiconductor device according to some example embodiments described with reference to FIG. 7.

Referring to FIG. 12, the cell region CELL may include a cell array region CAR and a cell contact region CTR. A plurality of channel structures CH may be disposed in the cell array region CAR. The plurality of channel structures CH may be disposed between adjacent wordline cuts WC.

The channel structures CH may be formed to be perpendicular to the substrate to form memory cell strings. The memory cell strings may be selected by a string select signal provided through a plurality of string select lines. Each of the string select lines may be separated by string select line cuts SC.

FIG. 12 illustrates string select lines SSL1 to SSL3. Current characteristics of the string select lines SSL1 to SSL3 may be different from each other. For example, the first and third string select lines SSL1 and SSL3 may be adjacent to a wordline cut WC. A first current I1 and a third current I3, flowing through the first and third string select lines SSL1 and SSL3, may flow relatively smoothly in a portion around the wordline cut WC. On the other hand, the second string select line SSL2 may not be in contact with the wordline cut WC. The second current I2, flowing through the second string select line SSL2, may be blocked by a plurality of channel structures CH to be prevented from flowing relatively smoothly.

According to some example embodiments, in a ground transistor, individual active regions may be formed to have different sizes to compensate for a difference in current characteristics of a string select line. For example, an active region, to which a string select line having relatively poor current characteristics is connected, may be formed to have a relatively large size.

Figure 13:
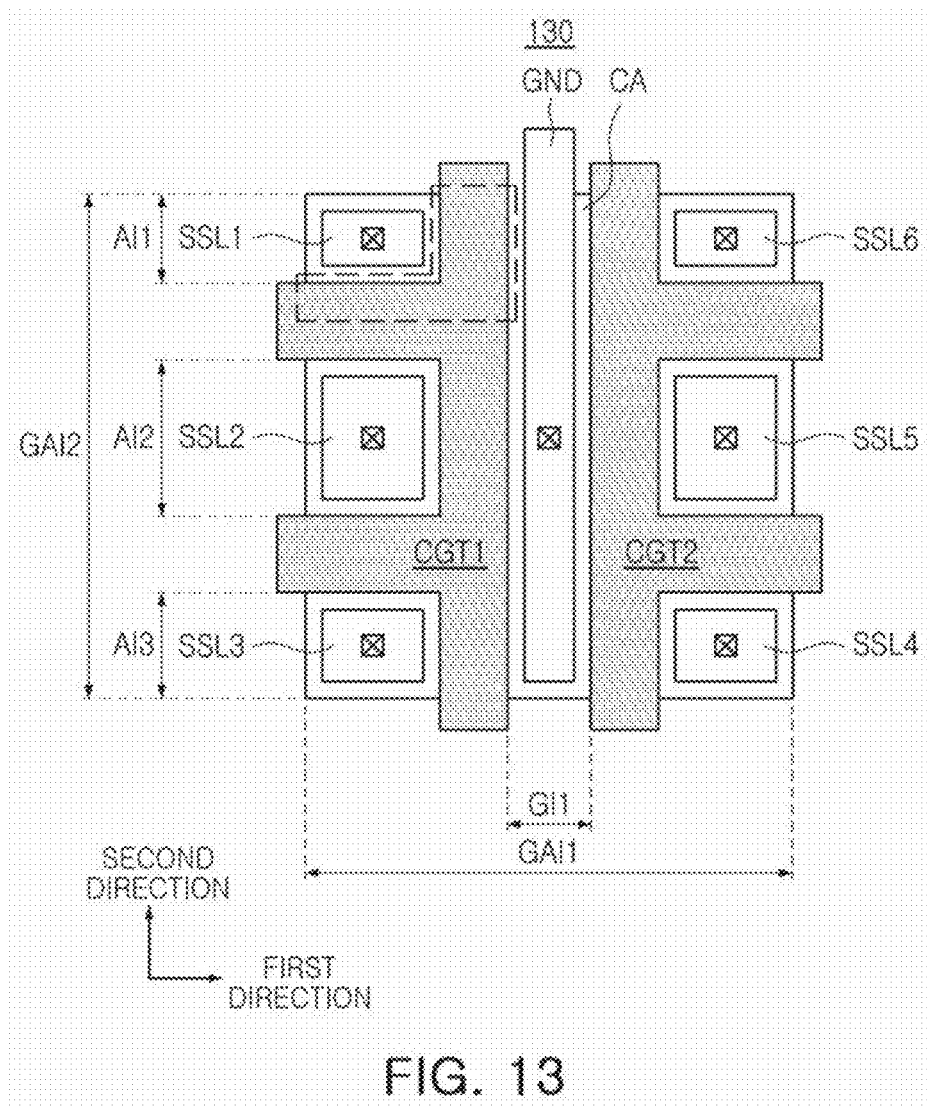
FIGS. 13 and 14 are diagrams illustrating devices disposed in a peripheral circuit region of a semiconductor device according to some example embodiments.
Figure 14:
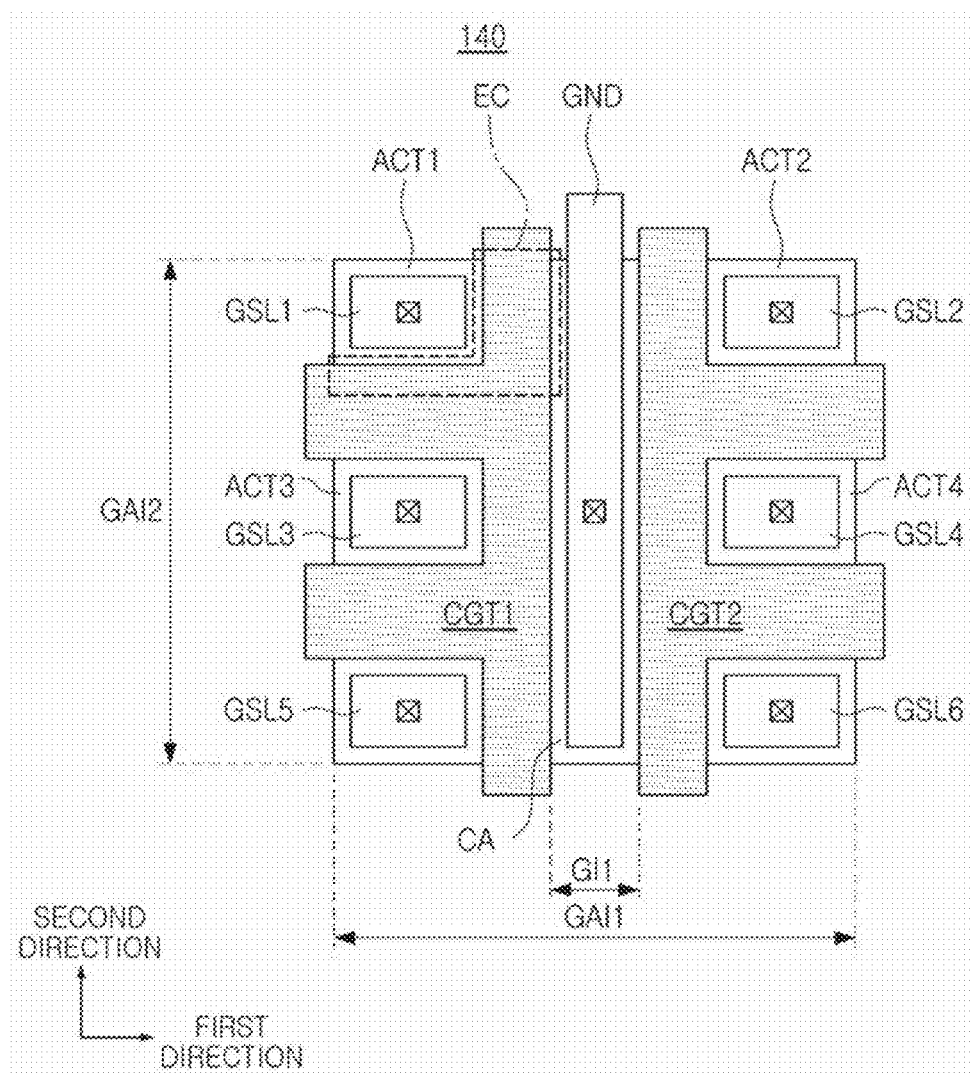

FIGS. 13 and 14 are diagrams illustrating devices disposed in a peripheral circuit region of a semiconductor device according to some example embodiments.

A semiconductor device according to some example embodiments may include a ground region 130. In an example of FIG. 13, ground transistors connected to string select lines SSL1 to SSL6 are illustrated. The ground transistors connected to the string select lines may be referred to as first to sixth ground transistors, respectively.

Ground transistors, included in the ground region 130, may have a structure similar to that of the ground transistors included in the ground region 110 described with reference to FIG. 10. However, in the ground transistors of the ground region 130, an active region connected to a string select line having relatively poor current characteristics may be formed to have a large size. For example, as described with reference to FIG. 12, current characteristics of the second string select line SSL2 may be poor, as compared with those of the first and third string select lines SSL1 and SSL3. According to some example embodiments, a second active region width AI2 of the second string select line SSL2 may be greater than first and third active region widths AI1 and AI3 of the first and third string select lines SSL1 and SSL3. Accordingly, a difference in current characteristics between the string select lines may be compensated for to improve performance of the semiconductor device.

Referring to FIGS. 9 to 13, some example embodiments has been described with respect to an example of SSL ground transistors to which string select lines are connected. However, example embodiments are not limited thereto. For example, as described with reference to FIG. 5, the semiconductor device 100 may further include GSL ground transistors to which ground select lines are connected. Example embodiments may also be applied to the GSL ground transistors.

FIG. 14 is a diagram illustrating devices disposed in a peripheral circuit region of a semiconductor device according to some example embodiments.

The semiconductor device 100 according to some example embodiments may include a ground region 140. In an example of FIG. 14, ground transistors connected to ground select lines GSL1 to GSL6 are illustrated. Ground transistors connected to the ground select lines GSL1 to GSL6 may be referred to as first to sixth ground transistors, respectively.

Ground transistors, included in the ground region 140, may have a structure similar to that of the ground transistors included in the ground region 110 described with reference to FIG. 10. For example, the first to sixth ground transistors may share a common active region CA connected to a ground GND. The first, third, and fifth ground transistors may share a first common gate structure CGT1. The first common gate structure CGT1 may be disposed between individual active regions of the first, third, and fifth ground transistors and the common active region CA. In addition, the first common gate structure CGT1 may extend between the individual active regions of the first, third, and fifth ground transistors. Similarly, the second, fourth, and sixth ground transistors may share a second common gate structure CGT2. The second common gate structure CGT2 may be disposed between individual active regions of the second, fourth, and sixth ground transistors and the common active region CA. In addition, the second common gate structure CGT2 may extend between the individual active regions of the second, fourth, and sixth ground transistors.

According to some example embodiments, the SSL grounding transistor and the GSL grounding transistor may share a common gate structure and a common active region, and the common gate structure may extend between the individual active regions of the SSL grounding transistor and the GSL grounding transistor. Some example embodiments will be described in detail with reference to FIGS. 15 to 17.

Figure 15:
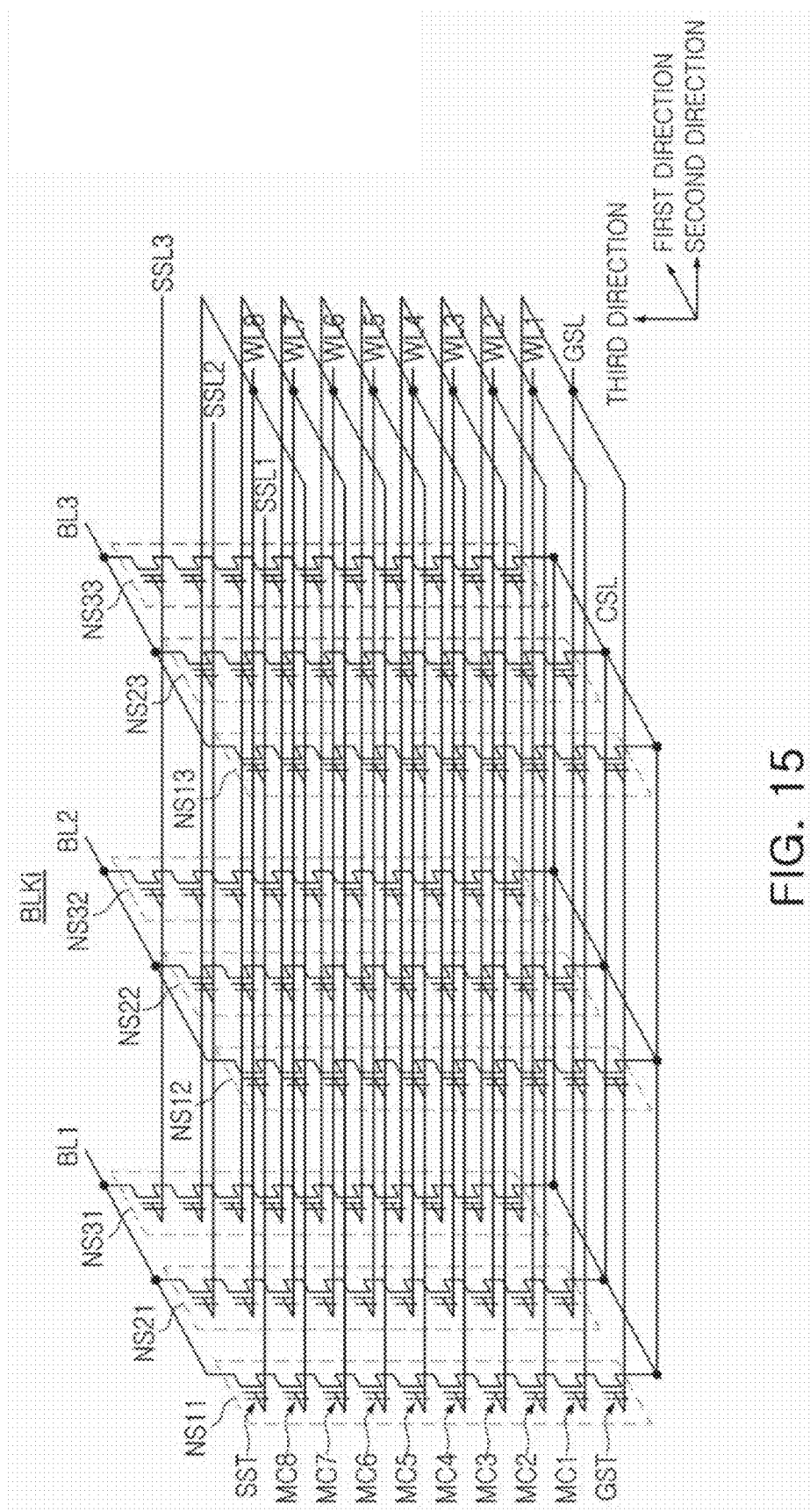
FIG. 15 is a schematic circuit diagram of a memory block of a semiconductor device according to some example embodiments.

FIG. 15 is a schematic circuit diagram of a memory block of a semiconductor device according to some example embodiments.

A memory block BLKi illustrated in FIG. 15 represents a three-dimensional (3D) memory block formed on a substrate in a 3D structure. For example, a plurality of NAND strings included in the memory block BLKi may be formed in a direction, perpendicular to the substrate.

The memory block BLKi illustrated in FIG. 15 may have a structure similar to that of the memory block BLKi illustrated in FIG. 4. However, unlike the example embodiments in which the ground select lines GSL1 to GSL3 of the memory block BLKi illustrated in FIG. 4 are separated from each other, a ground select line GSL of the memory block BLKi illustrated in FIG. 15 may be commonly connected.

Figure 16:
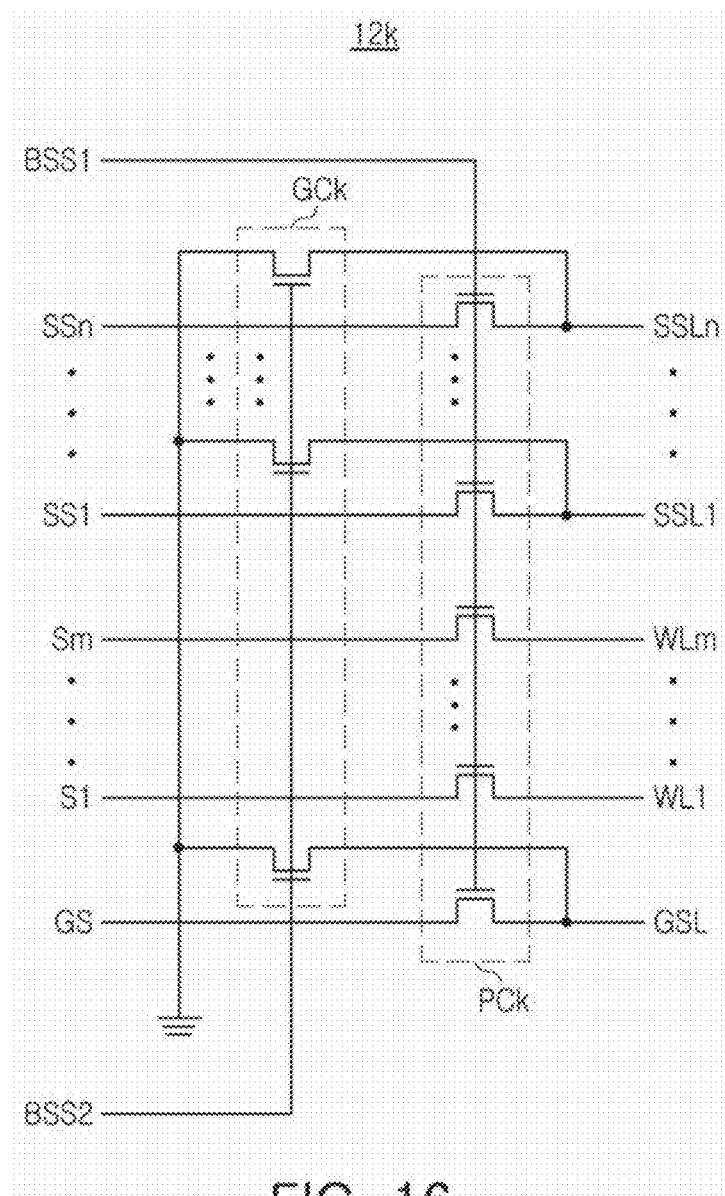
FIG. 16 is a diagram illustrating a gating circuit included in a block gating unit.

FIG. 16 is a diagram illustrating a gating circuit included in a block gating unit.

A gating circuit 22k illustrated in FIG. 16 may correspond to one of the gating circuits 221 to 22z described with reference to FIG. 3. Referring to FIG. 16, the gating circuit 22k may include a pass circuit PCk and a ground circuit GCk.

The gating circuit 22k illustrated in FIG. 16 may have a structure similar to that of the gating circuit 22k illustrated in FIG. 5. The gating circuit 22k illustrated in FIG. 5 includes pass transistors connecting ground select lines GSL1 to GSLn to ground lines GS1 to GSn and ground transistor connecting the ground select lines GSL1 to GSLn to a ground GND, whereas the gating circuit 22k illustrated in FIG. 16 may include a pass transistor connecting a ground select line GSL to a ground line GS and a ground transistor connecting the ground select line GSL to a ground GND.

According to some example embodiments, an SSL ground transistor connected to string select lines SSL1 to SSLn and a GSL ground transistor connected to the ground select line GSL may share a common active region with a gate structure.

Figure 17:
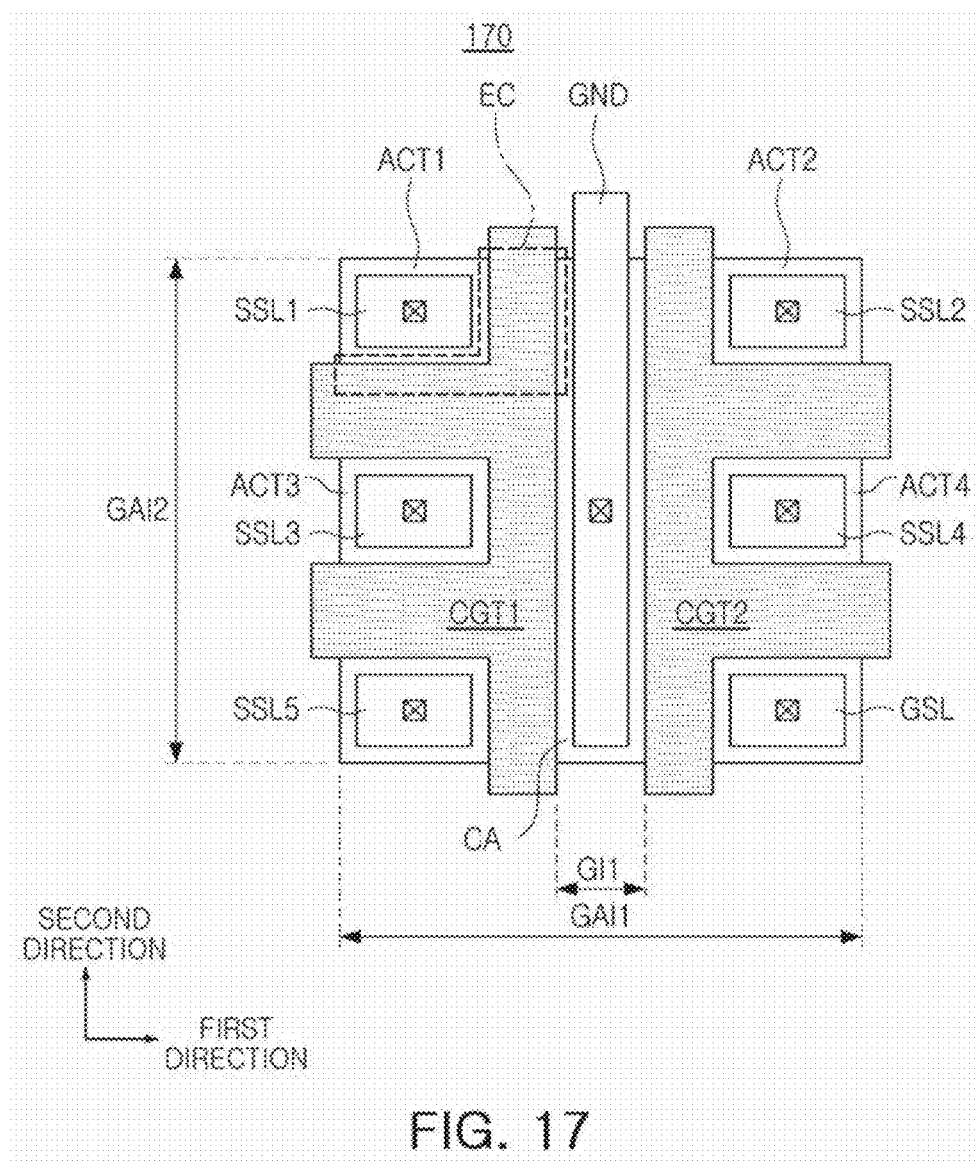
FIG. 17 is a diagram illustrating devices disposed in a peripheral circuit region of a semiconductor device according to some example embodiments.

FIG. 17 is a diagram illustrating devices disposed in a peripheral circuit region of a semiconductor device according to some example embodiments.

A semiconductor device according to some example embodiments may include a ground region 170.

The ground region 170 may include first to fifth SSL ground transistors connected to string select lines SSL1 to SSL5 and a GSL ground transistor connected to a ground select line GSL. According to some example embodiments, SSL ground transistors and a GSL ground transistor may share a common active region CA connected to a ground GND. The SSL ground transistors and the GSL ground transistor may further include individual active regions connected to select lines.

According to some example embodiments, second and fourth SSL ground transistors and the GSL ground transistor may share a second common gate structure CGT2. The second common gate structure CGT2 may be disposed between the individual active regions of the second and fourth SSL ground transistors and the GSL ground transistor and the common active region CA. In addition, the second common gate structure CGT2 may extend between the individual active regions of the second and fourth SSL ground transistors, and may also extend between the individual active regions of the fourth SSL ground transistor and the GSL ground transistor.

According to some example embodiments, the ground transistors may share a common active region and a common gate structure. Accordingly, an area occupied by a ground region may be reduced, and integration density of the semiconductor device may be improved.

According to the example embodiments described with reference to FIGS. 9 to 17, a plurality of ground transistors may share one or more common gate structures and one or more common active regions, and may include individual active regions. The common gate structure may extend in three or more different directions from a reference point. Each of the common active region and individual active regions may be adjacent to the gate structure in two directions, among the three or more directions. In addition, the common active region of the plurality of ground transistors may extend in a direction, different from a direction in which a plurality of pass transistors are arranged. According to some example embodiments, performance and integration density of the semiconductor device may be improved. Hereinafter, various examples of semiconductor devices, to which example embodiments may be applied, will be described with reference to FIGS. 18 to 22.

Figure 18:
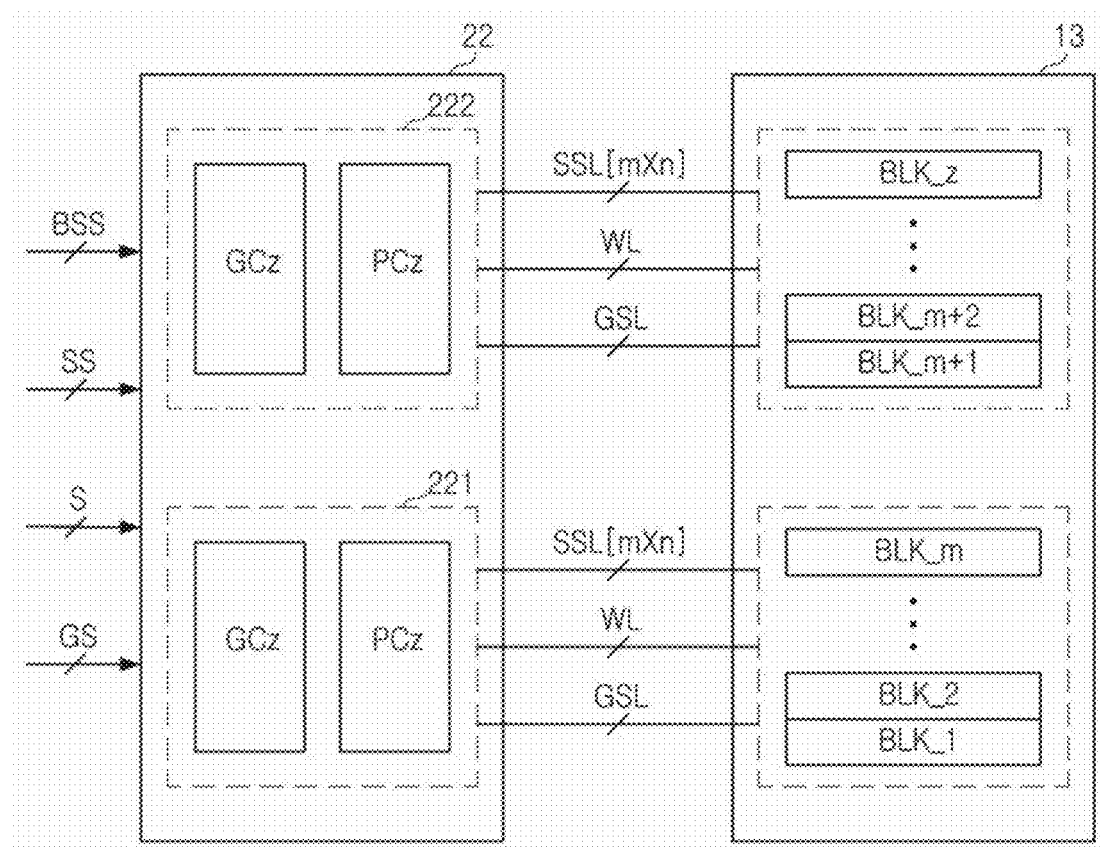
FIGS. 18 to 22 are diagrams illustrating various examples of semiconductor devices to which example embodiments are applied.

FIG. 18 is a diagram illustrating the block gating unit and the cell region, described with reference to FIGS. 1 and 2, in detail.

Referring to FIG. 18, a plurality of memory blocks may share a single ground circuit and a single pass circuit. The cell region 13 may include a plurality of memory blocks BLK1 to BLKz. The memory blocks BLK1 to BLKz may be grouped into a plurality of groups. For example, the memory blocks BLK1 to BLKz may be grouped into two groups, for example, one group including memory blocks BLK1 to BLKm, and the other group including memory blocks BLKm+1 to BLKz.

A block gating unit 22 may include a plurality of gating circuits 221 and 222. The gating circuits 221 and 222 may select and deselect memory block groups.

The gating circuits 221 and 222 connect string select lines SSL, wordlines WL, and a ground select line GSL of a selected memory block group to a row decoder 16 in response to a block select signal BSS. The gating circuits 221 and 222 may supply a ground voltage VSS to string select lines SSL, wordlines WL, and a ground select line GSL of an unselected memory block group in response to the block select signal BSS.

The gating circuits 221 and 222 may include ground circuits GCz (e.g., GC1 and GC2) and pass circuits PCz (e.g., PC1 and PC2). Each of the ground circuits GCz may be configured as described with reference to FIGS. 10, 11A to 11D, 13 and 17. For example, a plurality of ground transistors, which may control an unselected memory block group, may share a common gate structure and a common active region, and the common gate structure may extend between individual active regions of the ground transistors.

The semiconductor devices may have various structures depending on an arrangement of the cell region and the peripheral circuit region, and example embodiments may be applied to semiconductor devices having various structures.

Figure 19:
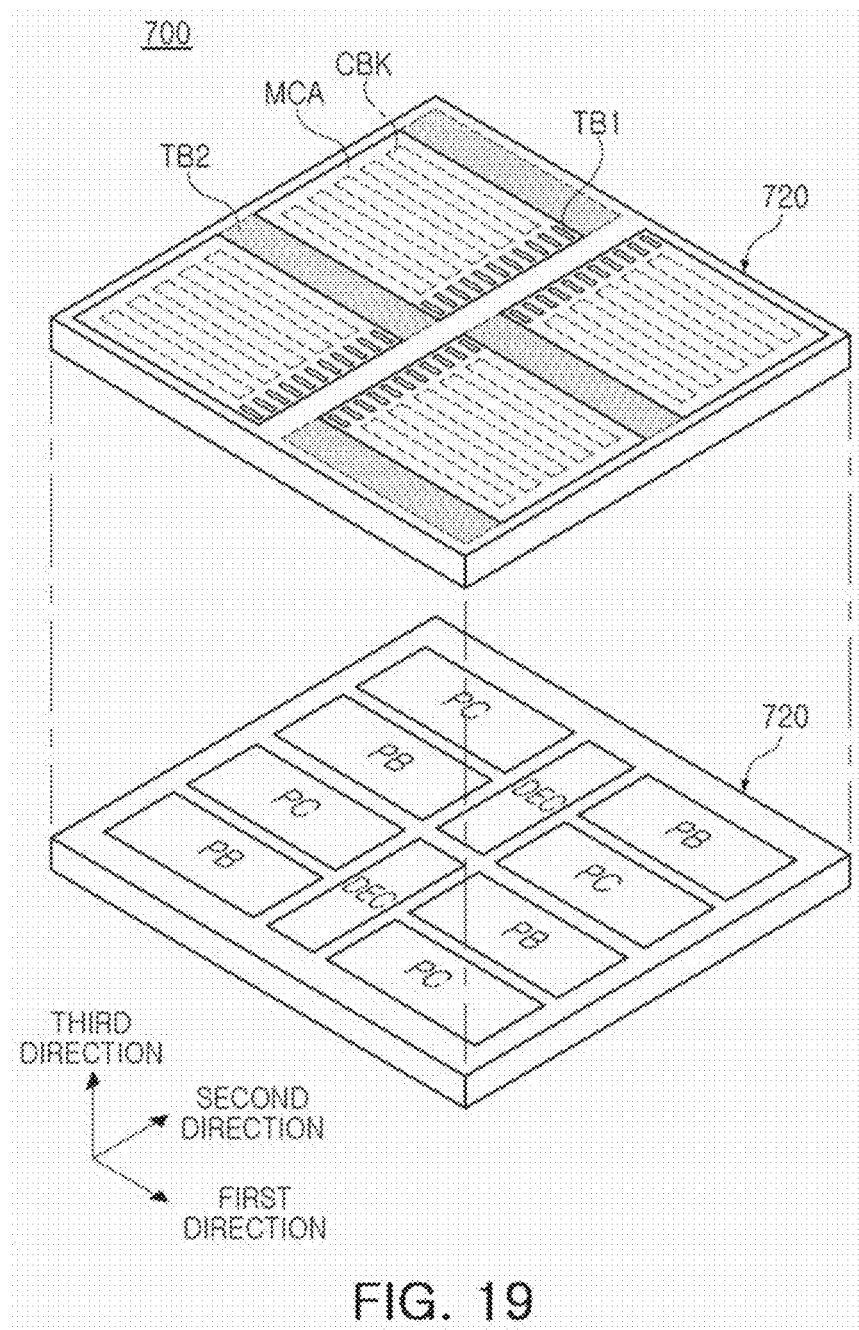

FIG. 19 is a schematic diagram illustrating a structure of a semiconductor device according to some example embodiments.

Referring to FIG. 19, a semiconductor device 700 may include a first region 710 and a second region 720 stacked in a third direction. The first region 710 may be a peripheral circuit region and may include a row decoder DEC, a page buffer PB, and a peripheral circuit PC formed on a first substrate. For example, the peripheral circuit PC may include a voltage generator, a source driver, an input/output circuit, and the like.

The second region 720 may be a cell region and may include memory cell arrays MCA and first and second penetration interconnection regions TB1 and TB2 formed on a second substrate. Penetration interconnections, connecting the first region 710 and the second region 720 to each other and extending in a vertical direction, may be disposed in each of the first and second penetration interconnection regions TB1 and tB2. Cell blocks CBK, included in each of the memory cell arrays MCA, may extend in a first direction and may be arranged in a second direction. According to example embodiments, at least one dummy block may be disposed between at least some of the cell blocks CBK.

The first region 710 may include a plurality of circuit device for implementing the row decoder DEC, the page buffer PB, the peripheral circuit PC, and the like, included in the peripheral circuit region and interconnection patterns connected to the circuit devices. The circuit devices may be divided into low-voltage devices and high-voltage devices, depending on a power supply voltage required for operation.

The row decoder DEC may include pass transistors and ground transistors. The pass transistors may connect string select lines, wordlines, and a ground select line of a selected memory block to string lines, select lines, and a ground line, respectively, in response to a block select signal. The ground transistors may connect string select lines, wordlines, and a ground select line of an unselected memory block to a ground in response to the block select signal to discharge the string select lines, the wordlines, and the ground select line. The pass transistors may be implemented as high-voltage devices, and the ground transistors may be implemented as low-voltage devices.

According to some example embodiments, the ground transistors may share a common gate structure, connected to the block select signal, and a common active region connected to a ground. Each of the ground transistors may further include individual active regions, different from the common active region, and the common gate structure may extend between the individual active regions.

According to some example embodiments, the common active region of the ground transistors may extend in a direction, different from a direction in which the individual active regions of the pass transistors are arranged.

Figure 20:
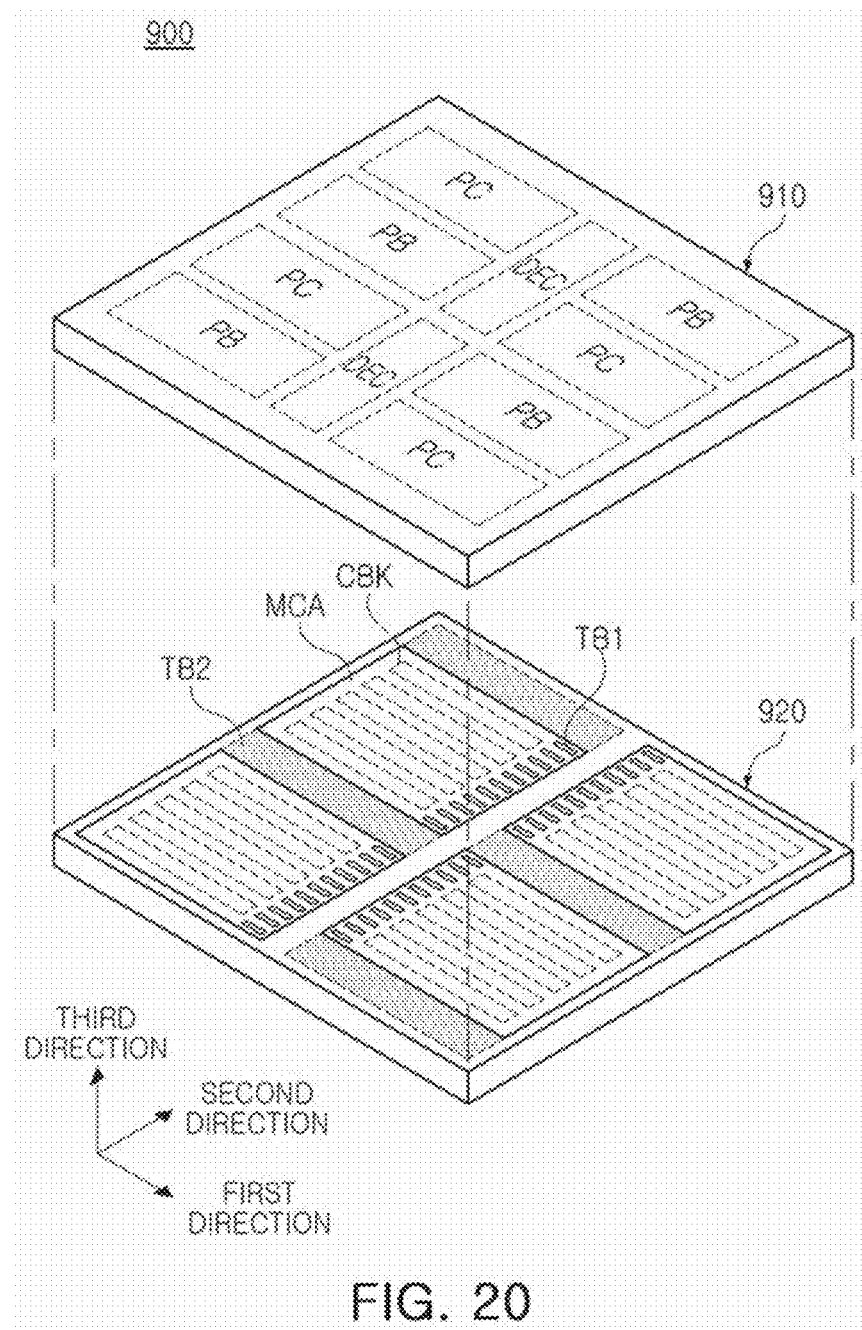

FIG. 20 is a schematic diagram illustrating a structure of a semiconductor device according to some example embodiments.

Referring to FIG. 20, the semiconductor device 900 may include a first region 910 and a second region 920 stacked in a third direction. The first region 910 may be a peripheral circuit region, and the second region 920 may be a cell region. Each of the first region 910 and the second region 920 may be similar to that described with reference to FIG. 19.

Unlike the example embodiments described with reference to FIG. 19, the example embodiments illustrated in FIG. 20 is some example embodiments in which a first region 910 including a peripheral circuit region may be coupled to a second region 920 while being inverted. Accordingly, the circuit devices included in the first region 910 and providing the row decoder DEC, the page buffer PB, and the peripheral circuit PC may be disposed between a first substrate of the first region 910 and a second substrate of the second region 920 in the third direction. Gate electrode layers, channel structures, and bitlines included in the second region 920, and the like, may be disposed between a first substrate of the first region 910 and a second substrate of the second region 920 in the third direction.

According to some example embodiments, the ground transistors included in the row decoder DEC may include a common gate structure and a common active region, and the common active region of the ground transistors may be disposed in a direction, different from a direction in which individual active regions of pass transistors are arranged. Accordingly, integration density of the semiconductor device 900 may be improved.

Figure 21:
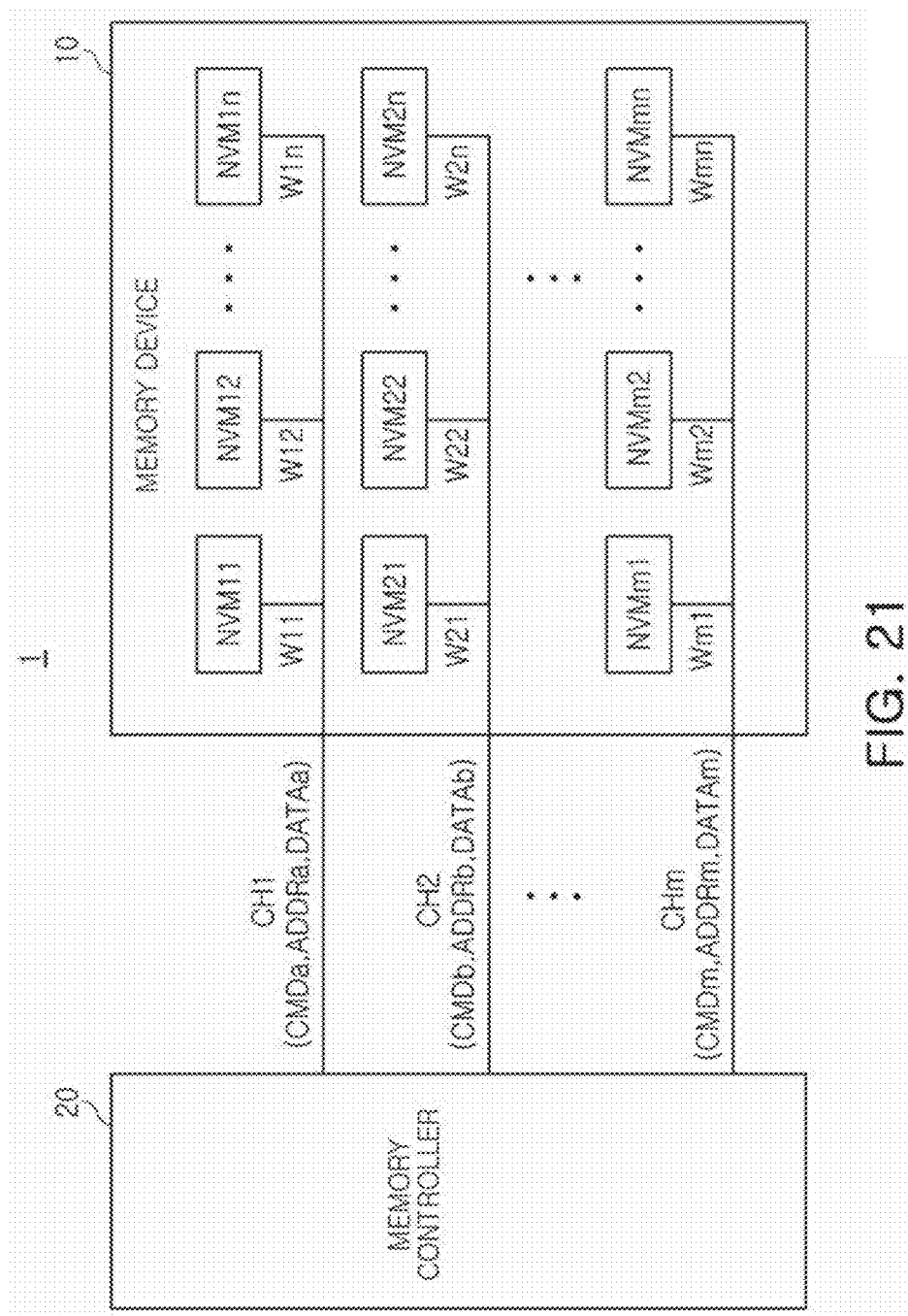

FIG. 21 is a schematic block diagram illustrating a system including a semiconductor device according to some example embodiments.

Referring to FIG. 21, a memory system 1 may include a semiconductor device 10, provided as a memory device, and a memory controller 20. The memory system 1 may support a plurality of channels CH1 to CHm, and the semiconductor device 10 and the memory controller 20 may be connected through the plurality of channels CH1 to CHm. For example, the memory system 1 may be implemented as a storage device such as a solid state drive (SSD).

The semiconductor device 10 may include a plurality of memory chips NVM11 to NVMmn. Each of the memory chips NVM11 to NVMmn may be connected to one of the plurality of channels CH1 to CHm through a corresponding way. For example, the memory devices NVM11 to NVM1*n* may be connected to the first channel CH1 through ways W11 to W1n, and the memory devices NVM21 to NVM2*n* may be connected to the second channel CH2 through ways W21 to W2*n*. In some example embodiments, each of the memory chips NVM11 to NVMmn may be implemented as an arbitrary memory unit which may operate based on an individual command from the memory controller 20. For example, each of the memory chips NVM11 to NVMmn may be implemented as a chip or a die, but example embodiments are not limited thereto.

The memory controller 20 may transmit and receive signals to and from the semiconductor device 10 through the plurality of channels CH1 to CHm. For example, the memory controller 20 may transmit commands CMDa to CMDm, addresses ADDRa to ADDRm, and data DATAa to DATAm to the semiconductor device 10 through the channels CH1 to CHm, or may receive the data DATAa to DATAm from the semiconductor device 10 through the channels CH1 to CHm.

The memory controller 20 may transmit and receive signals to and from the semiconductor device through different channels. For example, the memory controller 20 may transmit the command CMDb to the semiconductor device 10 through a second channel CH2 while transmitting the command CMDa to the semiconductor device 10 through a first channel CH1. For example, the memory controller 20 may receive the data DATAb from the semiconductor device 10 through the second channel CH2 while receiving the data DATAa from the semiconductor device 10 through the first channel CH1.

The memory controller 20 may control the overall operation of the semiconductor device 10. The memory controller 20 may transmit a signal to the channels CH1 to CHm to control the memory chips NVM11 to NVMmn, respectively connected to the channels CH1 to CHm. For example, the memory controller 20 may transmit the command CMDa and the address ADDRa to the first channel CH1 to control a selected one of the memory devices NVM11 to NVM1*n*.

Each of the memory chips NVM11 to NVMmn may operate under the control of the memory controller 20. For example, the memory device NVM11 may program the data DATAa according to the command CMDa, the address ADDRa, and the data DATAa provided to the first channel CH1. For example, the memory device NVM21 may read the data DATAb and may transmit the read data DATAb to the memory controller 20 according to the command CMDb and the address ADDRb provided to the second channel CH2.

In FIG. 21, the semiconductor device 10 is illustrated as communicating with the memory controller 20 through m channels and including n nonvolatile memory devices, respectively corresponding to channels. The number of the channels and the number of nonvolatile memory devices connected to a single channel may vary according to example embodiments.

The memory chips NVM11 to NVMmn may include a plurality of memory blocks, and may include pass transistors for selecting the memory blocks and ground transistors for deselecting the memory blocks. According to some example embodiments, the ground transistors may share a common gate structure and a common active region. The common active regions of the ground transistors, low-voltage devices, may be arranged in a direction, different from a direction in which individual active regions of the pass transistors, high-voltage devices, are arranged. Accordingly, integration density of the memory chips NVM11 to NVMmn may be improved.

Figure 22:
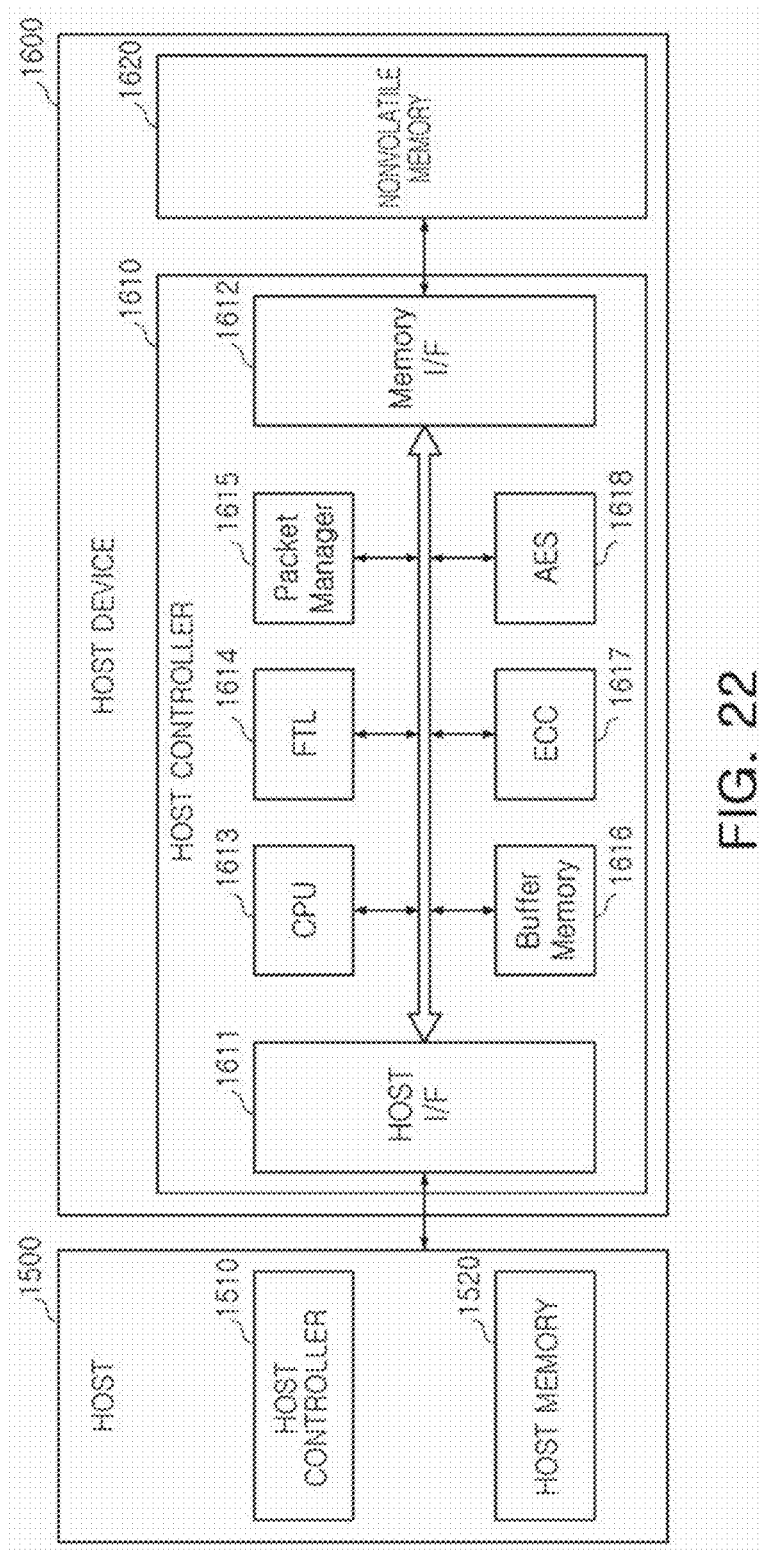

FIG. 22 is a block diagram illustrating a host-storage system according to some example embodiments.

The host-storage system 1400 may include a host 1500 and a storage device 1600. The storage device 1600 may include a storage controller 1610 and a nonvolatile memory (NVM) 1620. According to some example embodiments, the host 1500 may include a host controller 1510 and a host memory 1520. The host memory 1520 may function as a buffer memory for temporarily storing data to be transmitted to the storage device 1600 or data transmitted from the storage device 1600.

The storage device 1600 may include storage media for storing data depending on a request from the host 1500. As an example, the storage device 1600 may include at least one of a solid state drive (SSD), an embedded memory, and a removable external memory. When the storage device 1600 is an SSD, the storage device 1600 may be a device conforming to non-volatile memory express (NVMe) standards. When the storage device 1600 is an embedded memory or an external memory, the storage device 1600 may be a device conforming to universal flash storage (UFS) or embedded multi-media card (eMMC) standards. Each of the host 1500 and the storage device 1600 may generate a packet based on an adopted standard protocol and may transmit the generated packet.

When the nonvolatile memory 1620 of the storage device 1600 includes a flash memory, the flash memory may include a 2D NAND memory array or a 3D (or vertical) NAND (VNAND) memory array. As another example, the storage device 1600 may include other various types of nonvolatile memory. For example, the storage device 1600 may be a magnetic RAM (MRAM), a spin-transfer torque MRAM, a conductive bridging RAM (CBRAM), a ferroelectric RAM (FeRAM), a phase RAM (PRAM), a resistive memory (ReRAM), or any of various other types of memory.

According to some example embodiments, the host controller 1510 and the host memory 1520 may be implemented as separate semiconductor chips. Alternatively, in some example embodiments, the host controller 1510 and the host memory 1520 may be integrated on the same semiconductor chip. As an example, the host controller 1510 may be one of a plurality of modules included in an application processor, and the application processor may be implemented as a system-on-chip (SoC). In addition, the host memory 1520 may be an embedded memory provided in the application processor or a nonvolatile memory or a memory module disposed outside the application processor.

The host controller 1510 may manage an operation of storing data (for example, write data) of the host memory 1520 in the nonvolatile memory 1620, or an operation of storing data (for example, read data) of the nonvolatile memory 1620 in the host memory 1520.

The storage controller 1610 may include a host interface 1611, a memory interface 1612, and a central processing unit (CPU) 1613. The storage controller 1610 may further include a flash translation layer (FTL) 1614, a packet manager 1615, a buffer memory 1616, an error correction code (ECC) engine, and an advanced encryption standard (AES) engine 1618. The storage controller 1610 may further include a working memory in which the flash translation layer 1614 is loaded, and may control operations of writing and reading data in and from a nonvolatile memory by executing a flash translation layer by the host interface 1611.

The host interface 1611 may transmit and receive a packet to and from the host 1500. A packet, transmitted from the host 1500 to the host interface 1611, may include a command or data to be written to the nonvolatile memory 1620. A packet, transmitted from the host interface 1611 to the host 1500, may include a response to a command or data read from the nonvolatile memory 1620. The memory interface 1612 may transmit data to be written to the nonvolatile memory 1620 to the nonvolatile memory 1620, or may receive data read from the nonvolatile memory 1620. The memory interface 1612 may be implemented to comply with a standard protocol such as toggle or open NAND flash interface (ONFI).

The flash translation layer 1614 may perform various functions such as address mapping, wear-leveling, and garbage collection. The address mapping operation may be an operation of converting a logical address, received from the host, into a physical address used to actually store data in the nonvolatile memory 1620. The wear-leveling may be a technique for preventing excessive degradation (e.g., reducing degradation) of a specific block by allowing blocks in the nonvolatile memory 1620 to be uniformly used and may be implemented through, for example, a firmware technique for balancing erase counts of physical blocks. The garbage collection is a technique for securing capacity usable in the nonvolatile memory 1620 in a manner of copying valid data of a block to a new block and then erasing an existing block.

The packet manager 1615 may generate a packet complying with a protocol of an interface with the host 1500, or may parse various types of information from the packet. The buffer memory 1616 may temporarily store data to be written to the nonvolatile memory 1620 or data to be read from the nonvolatile memory 1620. The buffer memory 1616 may be provided in the storage controller 1610, but may be disposed outside the storage controller 1610.

The ECC engine 1617 may perform an error detection and correction function on read data read from the nonvolatile memory 1620. For example, the ECC engine 1617 may generate parity bits for write data to be written to the nonvolatile memory 1620, and the generated parity bits may be stored used together with the write data in the nonvolatile memory 1620. When data is read from the nonvolatile memory 1620, the ECC engine 1617 may correct an error in the read data using the parity bits read from the nonvolatile memory 1620 together with the read data and may output an error-corrected read data.

The AES engine 1618 may perform at least one of an encryption operation and a decryption operation on data input to the storage controller 1610 using a symmetric-key algorithm.

According to some example embodiments, integration density of a peripheral circuit region of the memory chips included in the storage device 1600 may be improved.

As described above, low-voltage devices may share an active region in a peripheral circuit region, and the low-voltage devices and high-voltage devices may be formed in different directions. According to example embodiments, performance and integration density of a semiconductor device may be improved.

As described herein, any devices, systems, modules, units, controllers, circuits, and/or portions thereof according to any of the example embodiments (including, without limitation, the semiconductor device 10, control logic circuit 12, cell region 13, page buffer unit 14, voltage generator 15, row decoder 16, address decoder 21, block gating unit 22, logic circuit 55, page buffers 73A, input/output circuit 74A, semiconductor device 700, semiconductor device 900, memory system 1, memory controller 20, host 1500, storage device 1600, sub-components or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, modules, units, controllers, circuits, and/or portions thereof according to any of the example embodiments, and/or any portions thereof.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While example embodiments have been shown and described above, it will be apparent to those skilled in the art that modifications and variations could be made without departing from the scope of the present inventive concept as defined by the appended claims.

What is claimed is:

1. A semiconductor device comprising:
a memory cell array including a plurality of memory blocks, each of the plurality of memory blocks including select transistors and memory cells;
an address decoder configured to generate a first control signal and a second control signal in response to a received address;
a plurality of metal lines connected to the plurality of memory blocks;
pass transistors configured to electrically connect metal lines, connected to a selected memory block, among the plurality of metal lines, to the address decoder in response to the first control signal; and
ground transistors configured to supply a first voltage to metal lines, connected to unselected memory blocks, among the plurality of metal lines, in response to the second control signal, wherein:
the ground transistors include at least one common gate structure, at least one common active region, and individual active regions, and each of at least one the common gate structure and the at least one common active region are shared by two or more ground transistors, among the ground transistors; and
each of at least one the common gate structure is between and contacting one of the at least one common active region and at least two of the individual active regions and includes a first region extending in a first direction and a second region extending in a second direction, intersecting the first direction.

2. The semiconductor device of claim 1, wherein widths of the individual active regions are determined based on current characteristics of string select lines connected to the individual active regions.

3. The semiconductor device of claim 2, wherein a width of an individual active region connected to a select line not adjacent to a wordline cut, is greater than a width of an individual active region connected to a select line adjacent to the wordline cut.

4. The semiconductor device of claim 1, wherein the ground transistors include
an SSL ground transistor, connected to a string select line, and
a GSL ground transistor connected to a ground select line.

5. The semiconductor device of claim 1, wherein individual active regions included in the pass transistors are arranged in the second direction, and
the at least one common active region of the ground transistors extend in the first direction, different from the second direction.

6. The semiconductor device of claim 5, wherein the first direction and the second direction are perpendicular to each other.

7. The semiconductor device of claim 6, wherein the pass transistors are high-voltage devices, and the ground transistors are low-voltage devices.

8. A semiconductor device comprising:
a memory cell array including a plurality of memory blocks, each of the plurality of memory blocks including a plurality of cell strings selected by a select line;
pass transistors configured to provide select signals to select lines, connected to a selected memory block, in response to a first block select signal; and
ground transistors configured to supply a first voltage to select lines, connected to unselected memory blocks, in response to a second block select signal, wherein:
the ground transistors include at least one common gate structure, at least one common active region, and individual active regions, and each of the at least one common gate structure and the at least one common active region is shared by two or more ground transistors, among the ground transistors;
the at least one common gate structure includes three or more gate regions extending in different directions; and
the at least one common active region and each of the individual active regions are adjacent to two gate regions, among the three or more gate regions.

9. The semiconductor device of claim 8, wherein the at least one common gate structure further includes a third region surrounding the at least one common active region; and
the individual active regions are on an external side of a common gate structure surrounding the common active region.

10. The semiconductor device of claim 8, wherein the at least one common gate structure further includes a fourth region surrounding at least one of the individual active regions; and
the at least one common active region is on an external side of the at least one common gate structure surrounding the individual active region.

11. The semiconductor device of claim 8, wherein widths of individual active regions of the ground transistors are determined based on current characteristics of a string select line connected to the individual active regions.

12. The semiconductor device of claim 11, wherein a width of an individual active region connected to a select line not adjacent to a wordline cut, is greater than a width of an individual active region connected to a select line adjacent to the wordline cut.

13. The semiconductor device of claim 8, wherein the ground transistors include an SSL ground transistor, connected to a string select line, and a GSL ground transistor connected to a ground select line; and
the SSL ground transistor and the GSL ground transistor share a common gate structure and a common active region.

14. The semiconductor device of claim 8, wherein the pass transistors are high-voltage devices, and the ground transistors are low-voltage devices.

15. The semiconductor device of claim 14, wherein the three or more gate regions include a first gate region and a second gate region, extending in opposing directions, and a third gate region extending to be perpendicular to the two gate regions,
one of the at least one common active region is adjacent to the first and second gate regions, and
the individual active regions include a first individual active region, adjacent to the first and third gate regions, and a second individual active region adjacent to the second and third gate regions.

16. The semiconductor device of claim 15, wherein:
individual active regions of the pass transistors are arranged in the same direction as the third gate region.

17. A semiconductor device comprising:
a memory cell array including a plurality of memory blocks, each of the plurality of memory blocks including a plurality of cell strings selected by a select line;
pass transistors configured to provide select signals to select lines, connected to a selected memory block, in response to a first block select signal; and
ground transistors configured to supply a first voltage to select lines, connected to unselected memory blocks, in response to a second block select signal, wherein:
the pass transistors include gate structures, arranged in a first direction, and active regions arranged in the first direction;
the ground transistors share a common gate structure and a common active region, and the common active region extends in a second direction, different from the first direction; and
a width of the common active region in the first direction is smaller than a width of each of the active regions of the pass transistors in the second direction.

18. The semiconductor device of claim 17, wherein
the ground transistors further include individual active regions; and
the common gate structure further extends between the individual active regions.

19. The semiconductor device of claim 17, wherein
the first direction and the second direction are perpendicular to each other.

20. The semiconductor device of claim 17, wherein
the pass transistors are high-voltage devices, and
the ground transistors are low-voltage devices.

* * * * *